(12) United States Patent
Said et al.

(10) Patent No.: US 11,968,834 B2
(45) Date of Patent: Apr. 23, 2024

(54) THREE-DIMENSIONAL MEMORY DEVICE INCLUDING DISCRETE CHARGE STORAGE ELEMENTS WITH LATERALLY-PROTRUDING PROFILES AND METHODS OF MAKING THEREOF

(71) Applicant: SANDISK TECHNOLOGIES LLC, Addison, TX (US)

(72) Inventors: Ramy Nashed Bassely Said, San Jose, CA (US); Raghuveer S. Makala, Campbell, CA (US); Senaka Kanakamedala, San Jose, CA (US); Fei Zhou, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 451 days.

(21) Appl. No.: 17/192,463

(22) Filed: Mar. 4, 2021

(65) Prior Publication Data
US 2022/0285386 A1  Sep. 8, 2022

(51) Int. Cl.
| | | |
|---|---|---|
| *H10B 43/27* | (2023.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/35* | (2023.01) | |

(52) U.S. Cl.
CPC ............ *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35
See application file for complete search history.

(56) References Cited

U.S. PATENT DOCUMENTS

2017/0221921 A1*  8/2017  Kanamori ............. H10B 43/27
2019/0198509 A1*  6/2019  Kim .................. H01L 29/40117
(Continued)

OTHER PUBLICATIONS

Notification of Transmittal of the International Search Report and the Written Opinion of the International Searching Authority for International Patent Application No. PCT/US2021/034143, dated Dec. 2, 2021, 12 pages.

*Primary Examiner* — Fernando L Toledo
*Assistant Examiner* — Jahae Kim
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, memory openings vertically extending through the alternating stack and having lateral protrusions at levels of the electrically conductive layers, and memory opening fill structures located in the memory openings. Each of the memory opening fill structures includes a vertical semiconductor channel, a dielectric material liner laterally surrounding the vertical semiconductor channel, and a vertical stack of discrete memory elements laterally surrounding the dielectric material liner and located within volumes of the lateral protrusions. Each discrete memory element includes a vertical inner sidewall and a convex or stepped outer sidewall.

19 Claims, 30 Drawing Sheets

(56) References Cited

U.S. PATENT DOCUMENTS

| | | |
|---|---|---|
| 2019/0198510 A1 | 6/2019 | Kim |
| 2019/0386022 A1* | 12/2019 | Kim .................. H10B 43/27 |
| 2020/0286903 A1 | 9/2020 | Cui et al. |
| 2020/0388631 A1* | 12/2020 | Bin .................. H10B 41/35 |
| 2020/0395407 A1 | 12/2020 | Takahashi et al. |
| 2020/0411552 A1* | 12/2020 | Bin .................. H01L 29/1037 |
| 2021/0265383 A1* | 8/2021 | Kim .................. H10B 43/27 |
| 2022/0139943 A1* | 5/2022 | Go .................. H10B 43/35 |
| | | 257/314 |

* cited by examiner

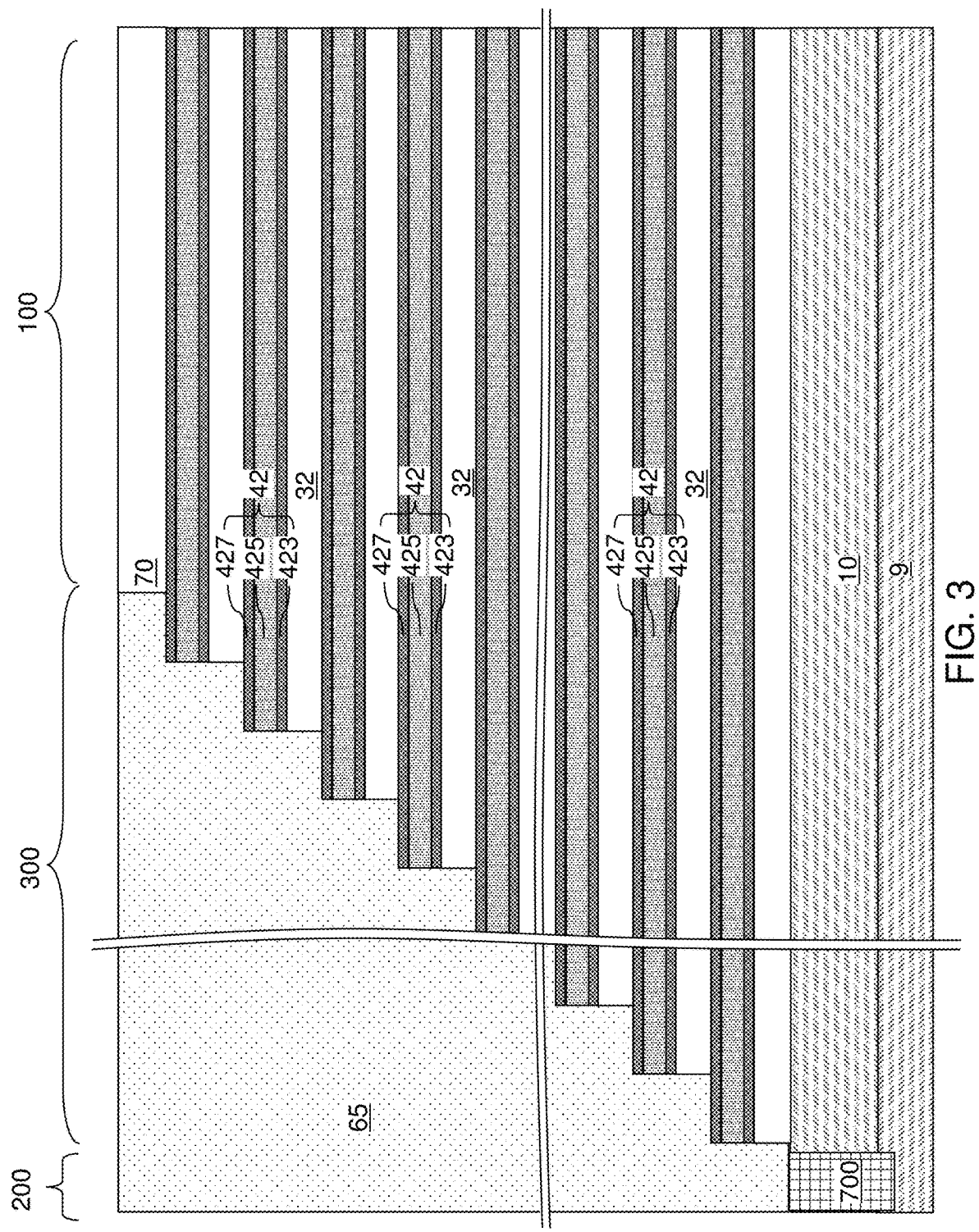

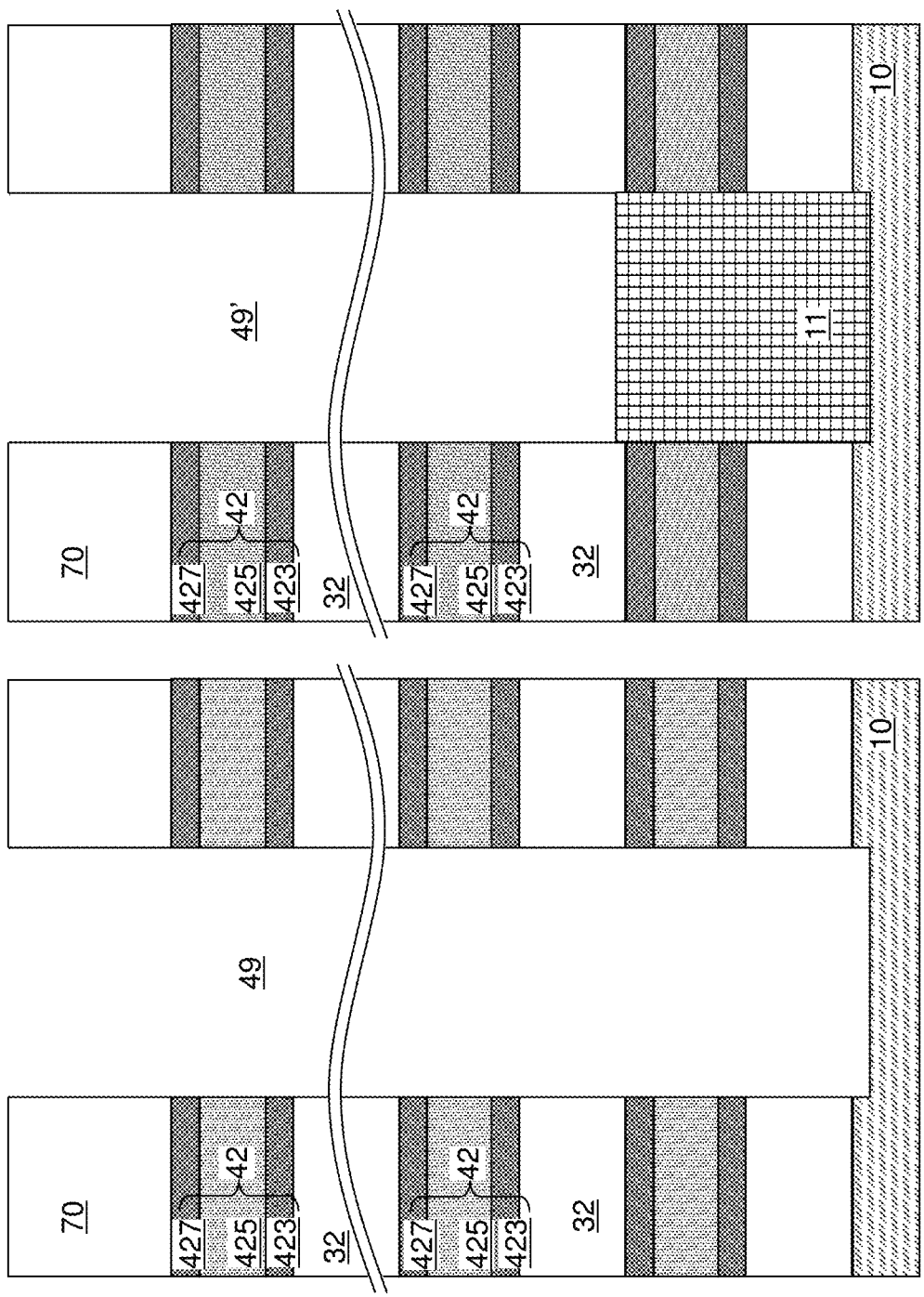

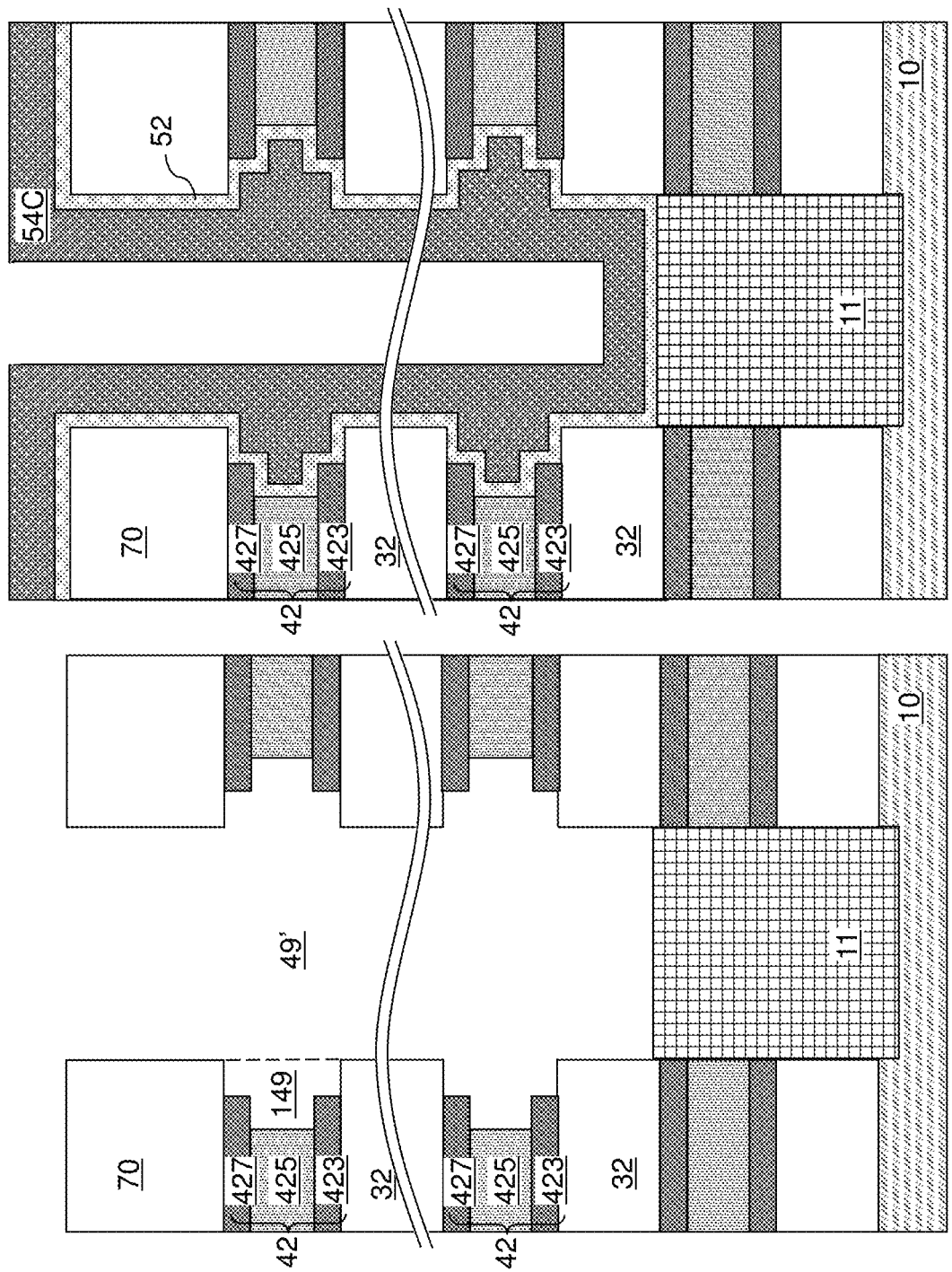

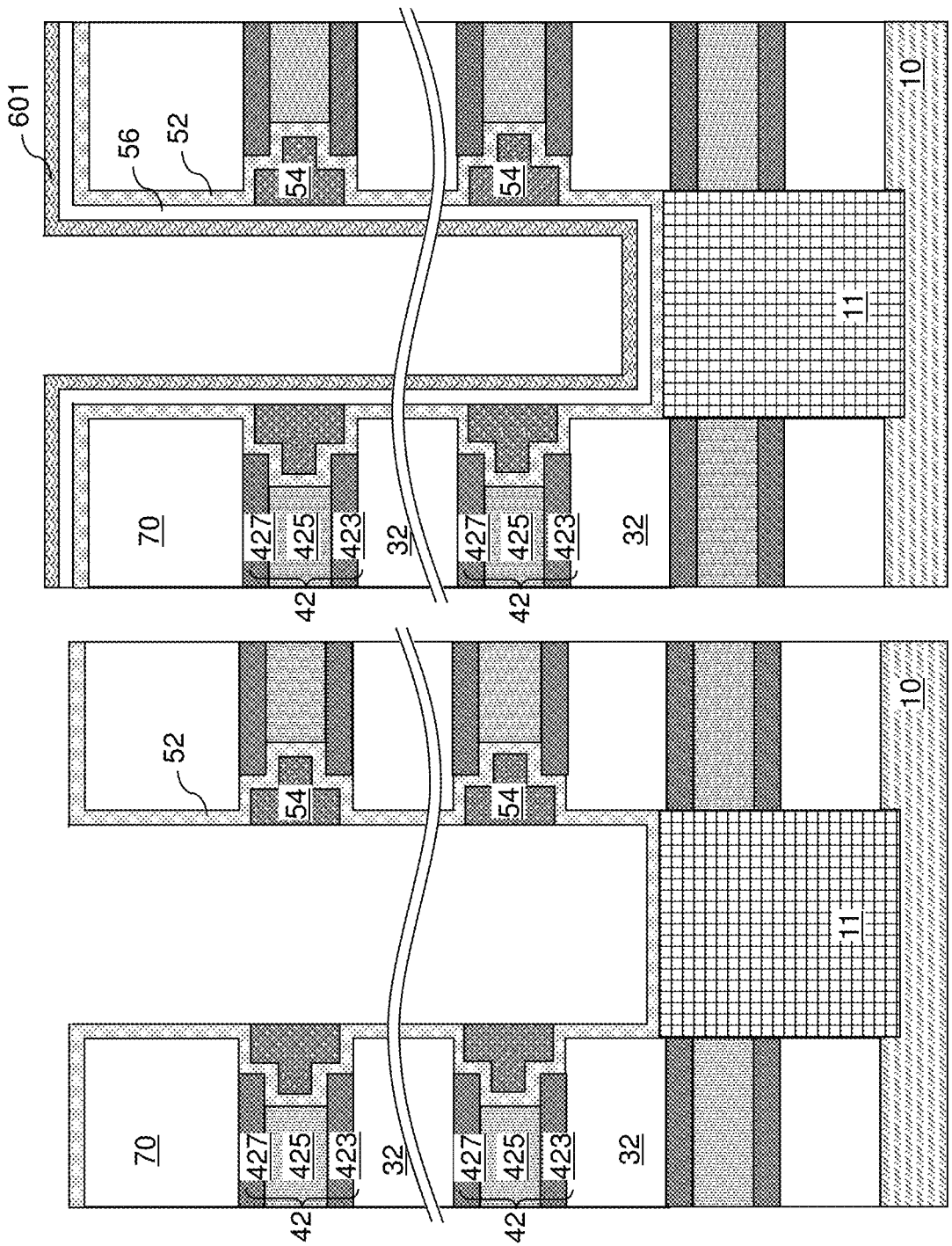

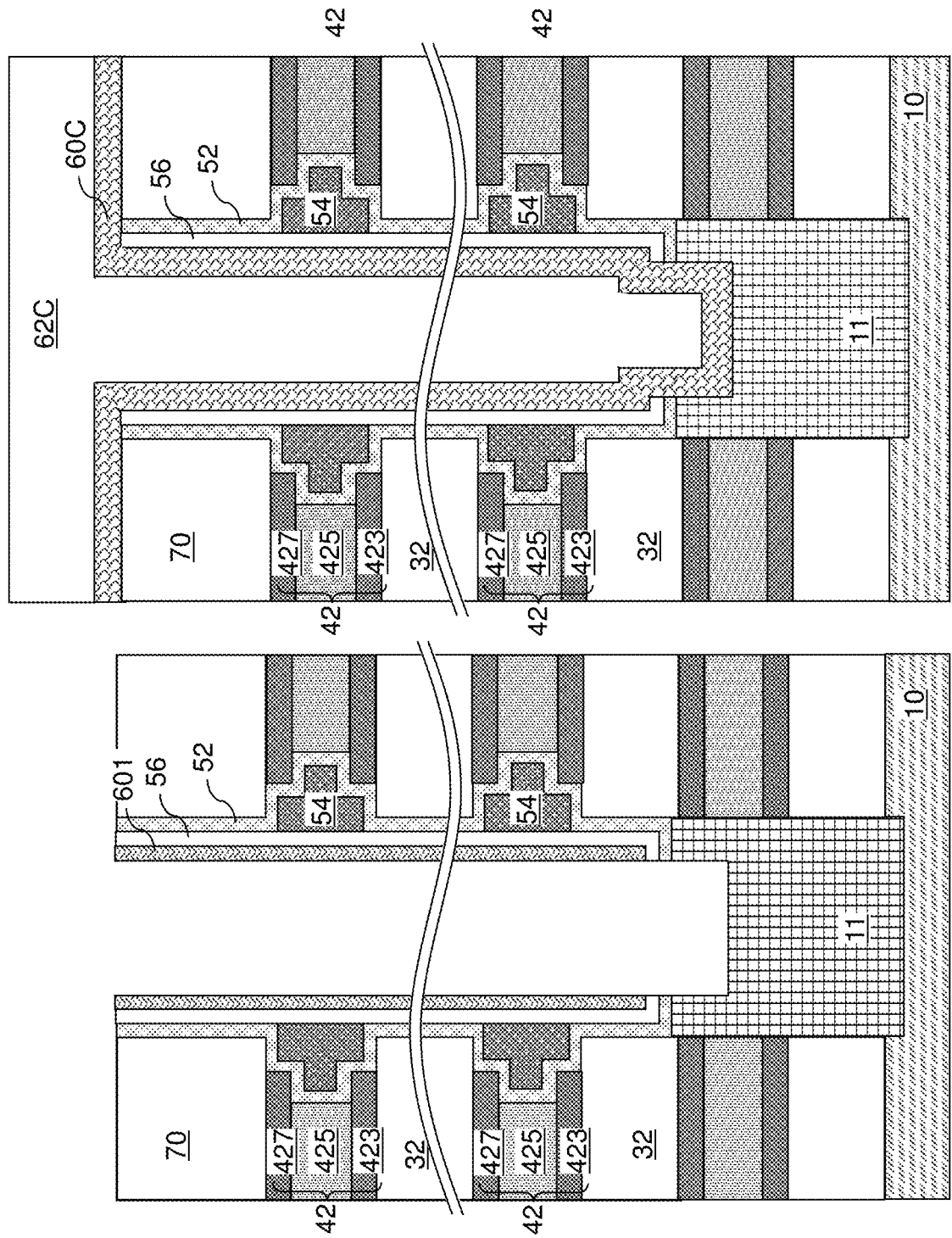

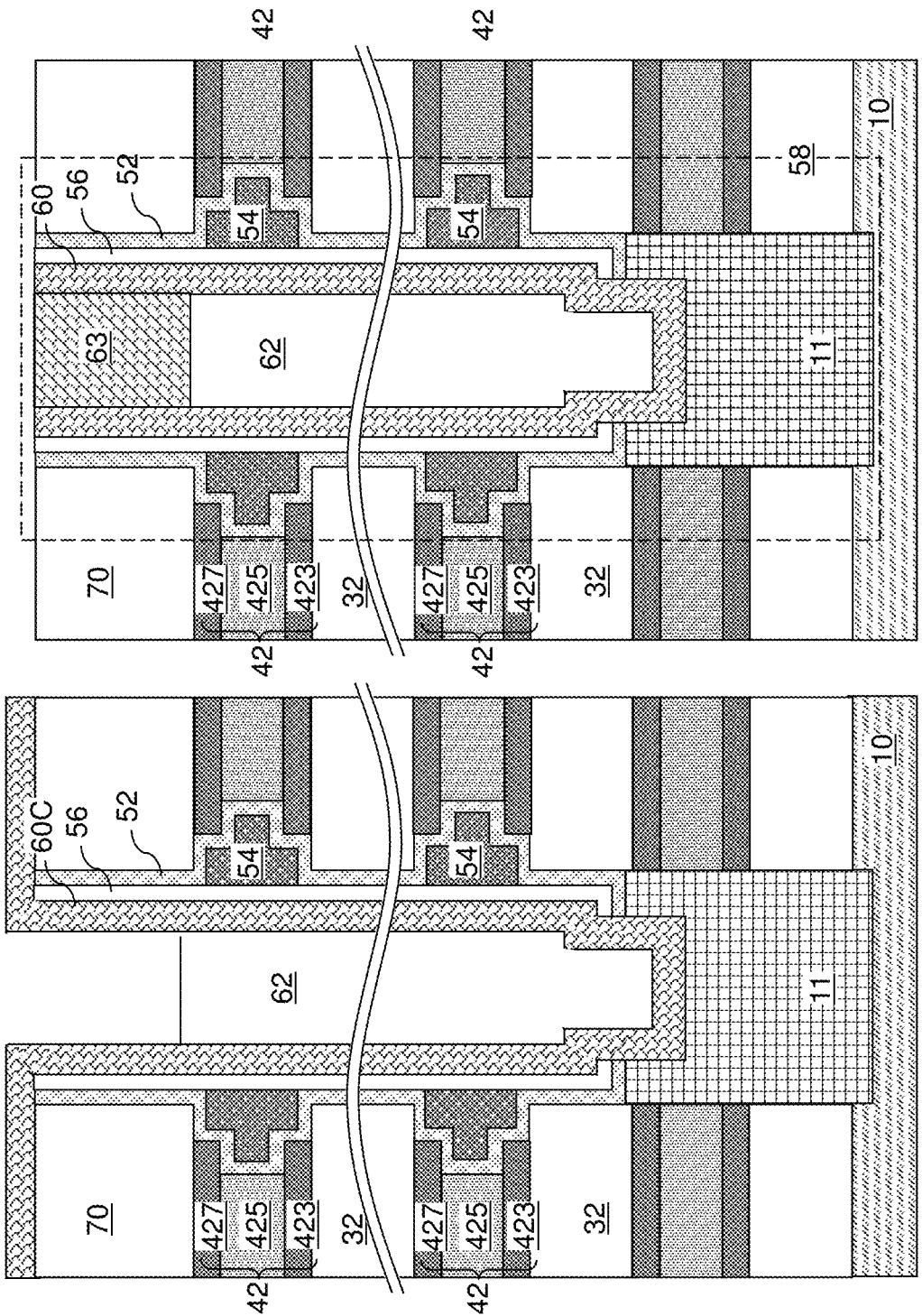

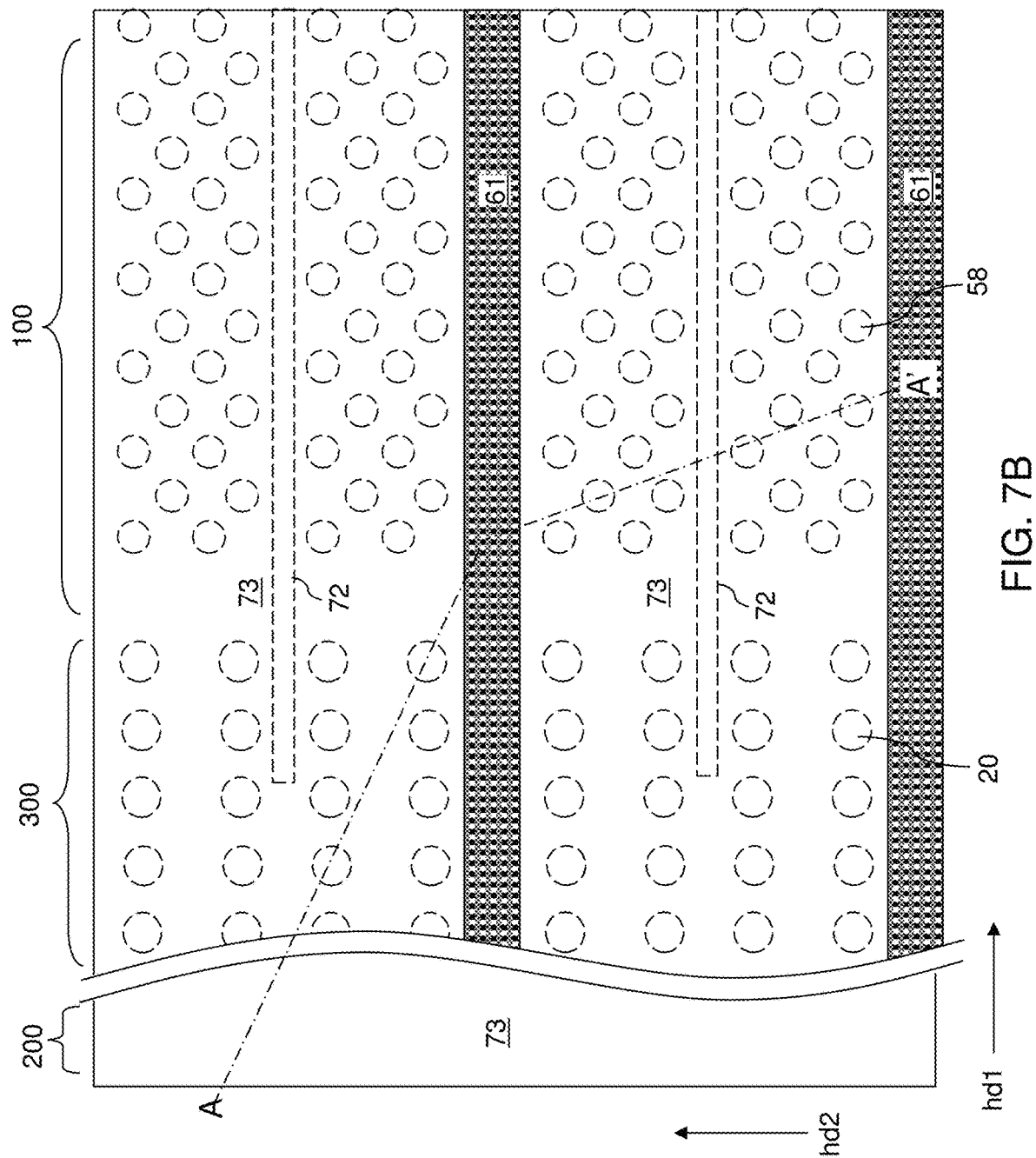

THREE-DIMENSIONAL MEMORY DEVICE INCLUDING DISCRETE CHARGE STORAGE ELEMENTS WITH LATERALLY-PROTRUDING PROFILES AND METHODS OF MAKING THEREOF

FIELD

The present disclosure relates generally to the field of semiconductor devices, and particularly to a three-dimensional memory device including discrete charge storage elements with laterally-protruding profiles and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory openings vertically extending through the alternating stack and having lateral protrusions at levels of the electrically conductive layers; and memory opening fill structures located in the memory openings, wherein each of the memory opening fill structures comprises a vertical semiconductor channel, a dielectric material liner laterally surrounding the vertical semiconductor channel, and a vertical stack of discrete memory elements laterally surrounding the dielectric material liner and located within volumes of the lateral protrusions, wherein each discrete memory element within the vertical stack of discrete memory elements comprises a vertical inner sidewall and a convex or stepped outer sidewall that is laterally offset outward from the vertical inner sidewall by a greater lateral offset distance at a central segment thereof than at a top segment thereof and than at a bottom segment thereof.

According to another aspect of the present disclosure, a method of forming a semiconductor structure is provided, which comprises: forming a vertical repetition of a unit layer stack, wherein the unit layer stack comprises, from bottom to top, an insulating layer, a first sacrificial material layer having a first etch rate in an isotropic etchant, a second sacrificial material layer having a second etch rate in the isotropic etchant that is greater than the first etch rate, and a third sacrificial material layer having a third etch rate in the isotropic etchant that is less than the second etch rate; forming memory openings having straight sidewalls through the vertical repetition; laterally recessing the first, second, and third sacrificial material layers selective to the insulating layers by introducing an isotropic etchant into the memory openings, wherein each sidewall of the memory openings comprises a stepped surface between each vertically neighboring pair of the insulating layers; forming a memory opening fill structure within each of the memory openings, wherein each memory opening fill structure comprises a vertical stack of discrete memory elements that are formed in lateral recesses around a respective one of the memory openings, a dielectric material liner, and a vertical semiconductor channel; and replacing the first, second, and third sacrificial material layers with electrically conductive layers.

According to yet another aspect of the present disclosure, a method of forming a semiconductor structure, comprising: forming a vertical repetition of a unit layer stack over a substrate, wherein the unit layer stack comprises, from bottom to top, an insulating layer and a compositionally-graded sacrificial material layer having a vertically-graded etch rate in an isotropic etchant that increases with a vertical distance from the substrate in a lower portion of the compositionally-graded sacrificial material layer and decreases with the vertical distance from the substrate in an upper portion of the compositionally-graded sacrificial material layer; forming memory openings having straight sidewalls through the vertical repetition; laterally recessing the compositionally-graded sacrificial material layers selective to the insulating layers by introducing an isotropic etchant into the memory openings, wherein each sidewall of the memory openings comprises a concave surface of a respective compositionally-graded sacrificial material layer between each vertically neighboring pair of the insulating layers; forming a memory opening fill structure within each of the memory openings, wherein each memory opening fill structure comprises a vertical stack of discrete memory elements that are formed in lateral recesses around a respective one of the memory openings, a dielectric material liner, and a vertical semiconductor channel; and replacing the first, second, and third sacrificial material layers with electrically conductive layers.

BRIEF DESCRIPTION OF THE DRAWINGS

FIG. 3 is a schematic vertical cross-sectional view of the first exemplary structure after formation of stepped terraces and a retro-stepped dielectric material portion according to the first embodiment of the present disclosure.

FIGS. 5A-5J are sequential schematic vertical cross-sectional views of a memory opening within the first exemplary structure during formation of a memory opening fill structure according to the first embodiment of the present disclosure.

FIG. 7B is a partial see-through top-down view of the first exemplary structure of FIG. 7A. The vertical plane A-A' is the plane of the schematic vertical cross-sectional view of FIG. 7A.

DETAILED DESCRIPTION

Figure 1:
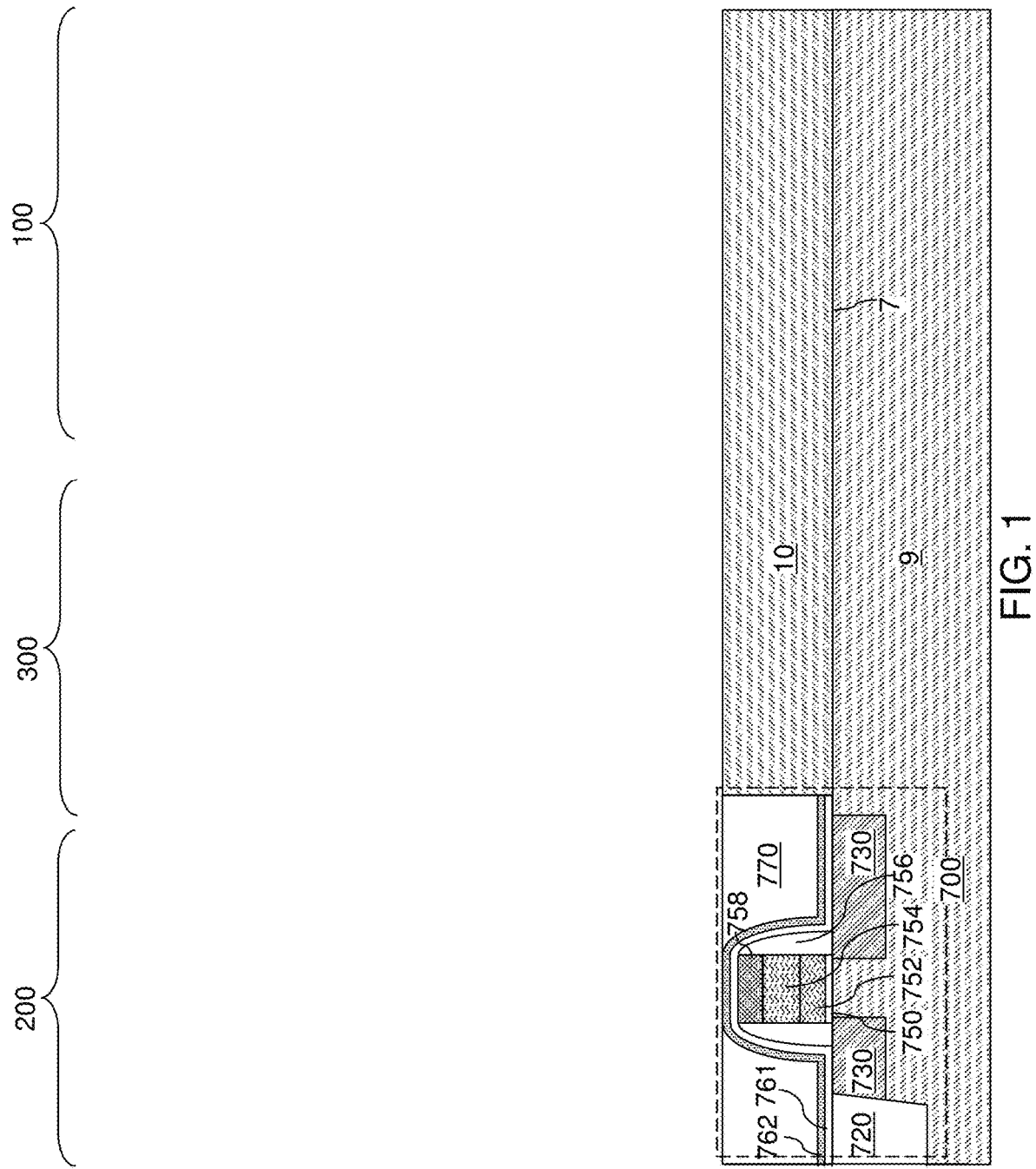
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to a three-dimensional memory device including discrete charge storage elements with laterally-protruding profiles which reduces neighboring word line interference and methods of manufacturing the same, the various aspects of which are described below. The embodiments of the disclosure can be employed to form various structures including a multi-level memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
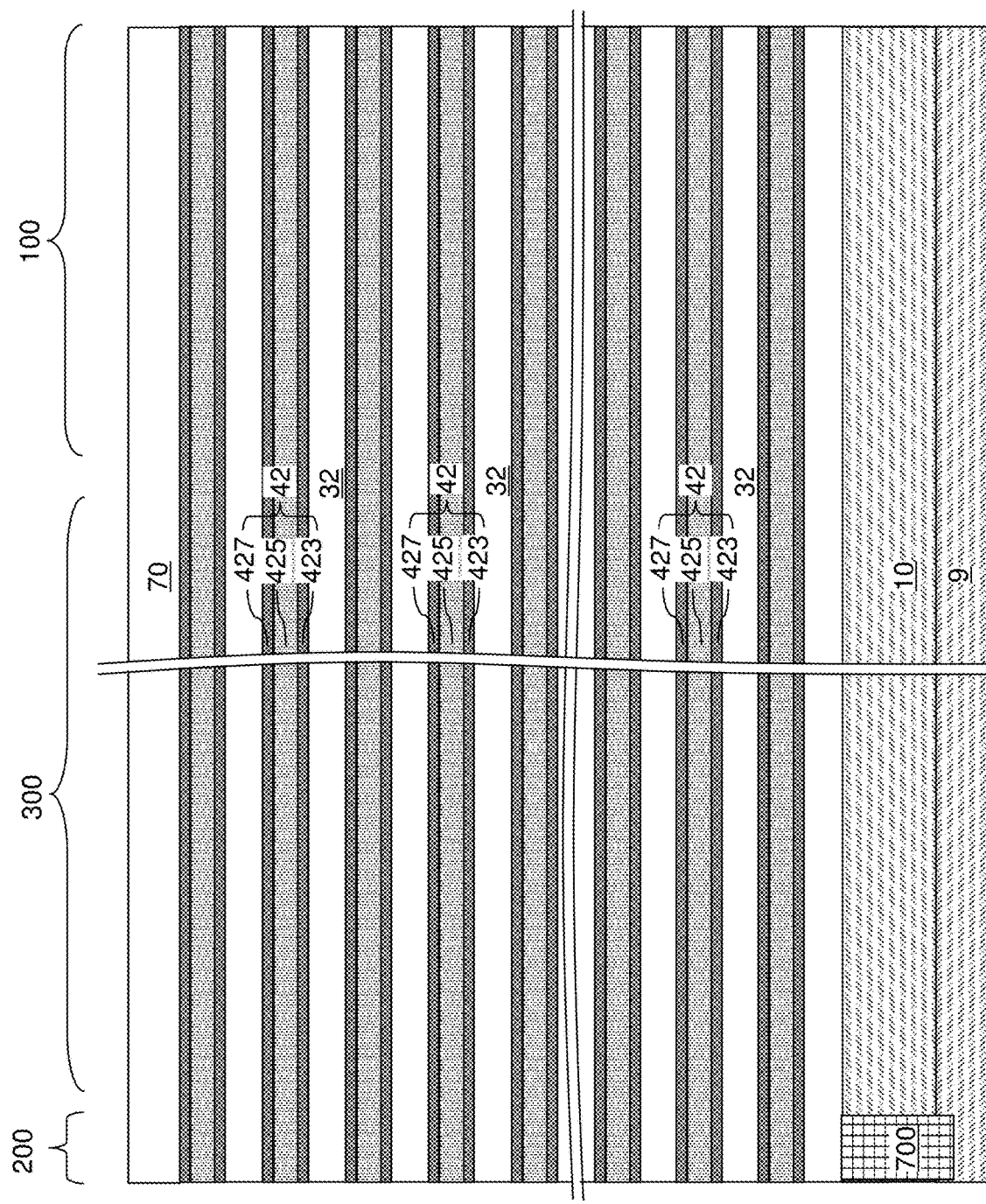
FIG. 2 is a schematic vertical cross-sectional view of the first exemplary structure after formation of a vertical repetition of a unit layer stack according to the first embodiment of the present disclosure.

Referring to FIG. 2, a vertical repetition of a unit layer stack (32, 42) is formed over the semiconductor material layer 10. The unit layer stack comprises, from bottom to top, an insulating layer 32, a first sacrificial material layer 423 having a first etch rate in an isotropic etchant, a second sacrificial material layer 425 having a second etch rate in the isotropic etchant that is greater than the first etch rate, and a third sacrificial material layer 427 having a third etch rate in the isotropic etchant that is less than the second etch rate. Each contiguous combination of a first sacrificial material layer 423, a second sacrificial material layer 425, and a third sacrificial material layer 427 constitutes a composite sacrificial material layer 42.

In a first non-limiting illustrative example, the first sacrificial material layer 423, and the third sacrificial material layer 427 comprise silicon nitride layers having a first density and a second sacrificial material layer 425 comprises a silicon nitride layer having a second density that is lower than the first density. The second density may be lower by at least 5%, such as 5 to 15%, for example 7 to 10% than the first density. For example, the second sacrificial material layer 425 may include a more porous silicon nitride material having a density in a range from 2.2 g/cm$^3$ to 2.35 g/cm$^3$. Such a porous silicon nitride material may be deposited by a plasma enhanced chemical vapor deposition process in which a higher plasma power is employed, and can have an etch rate in a range from 25 nm/min to 90 nm/min, such as 80 nm/min to 88 nm/min in a 100:1 dilute hydrofluoric acid at room temperature. In contrast, the first and third sacrificial material layers (423, 427) may include a non-porous silicon nitride material or a less porous silicon nitride material having a greater density than the more porous silicon nitride material of the second sacrificial silicon material layers 425. In one embodiment, the first and third sacrificial material layers (423, 427) can have a density in a range from 2.45 g/cm$^3$ to 2.65 g/cm$^3$. Such non-porous or less porous silicon nitride material may be deposited by a plasma enhanced chemical vapor deposition process in which a lower plasma power is employed, and can have an etch rate in a range from 2.5 nm/min to 20 nm/min, in a 100:1 dilute hydrofluoric acid at room temperature.

In a second non-limiting illustrative example, the first sacrificial material layers 423 can comprise, and/or can consist essentially of, a first silicon-germanium alloy including germanium atoms at a first atomic concentration. In this case, the material composition of the first sacrificial material layers 423 may be $Si_{1-\alpha 1}Ge_{\alpha 1}$, in which $\alpha 1$ is in a range from 0 to 0.1. The first silicon-germanium alloy may be deposited, for example, by plasma-enhanced physical vapor deposition. The second sacrificial material layers 425 can comprise, and/or can consist essentially of, a second silicon-germanium alloy or germanium including germanium atoms at a second atomic concentration which is greater than the first atomic concentration. The material composition of the second sacrificial material layers 425 may be $Si_{1-\alpha 2}Ge_{\alpha 2}$, in which $\alpha 2$ is in a range from 0.5 to 1. The second silicon-germanium alloy may be deposited, for example, by plasma-enhanced physical vapor deposition. The third sacrificial material layers 427 can comprise, and/or can consist essentially of, a third silicon-germanium alloy including germanium atoms at a third atomic concentration, which may equal the first atomic concentration but which is less than the second atomic concentration. The material composition of the third sacrificial material layers 427 may be $Si_{1-\alpha 3}Ge_{\alpha 3}$, in which $\alpha 3$ is in a range from 0 to 0.1. The third silicon-germanium alloy may be deposited, for example, by plasma-enhanced physical vapor deposition. In this case, the isotropic etchant may comprise a mixture of hydrofluoric acid and hydrogen peroxide.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

Optionally, the composite sacrificial material layers 42 can be suitably patterned so that conductive material portions to be subsequently formed by replacement of the composite sacrificial material layers 42 can function as electrically conductive electrodes, such as the control gate electrodes of the three-dimensional NAND string memory devices to be subsequently formed. The composite sacrificial material layers 42 may comprise a portion having a strip shape extending substantially parallel to the major surface 7 of the substrate.

The thicknesses of the insulating layers 32 and the composite sacrificial material layers 42 can be in a range from 20 nm to 50 nm, although lesser and greater thicknesses can be employed for each insulating layer 32 and for each composite sacrificial material layer 42. The thickness of each of the first sacrificial material layers 423, the second sacrificial material layers 425, and the third sacrificial material layers 437 may be in a range from 20% to 60%, such as from 30% to 40%, of the thickness of a composite sacrificial material layer 42. In this embodiment, the second sacrificial material layer 425 may be thicker than each of the first and third sacrificial material layers (423, 427), such as two to ten times thicker. For example, the second sacrificial material layer 425 may have a thickness from 15 nm to 25 nm, and each of the first and third sacrificial material layers (423, 427) may have a thickness from 2 nm to 10 nm. The number of repetitions of the pairs of an insulating layer 32 and a composite sacrificial material layer 42 can be in a range from 2 to 1,024, and typically from 8 to 256, although a greater number of repetitions can also be employed. In one embodiment, each composite sacrificial material layer 42 in the vertical repetition (32, 42) can have a uniform thickness that is substantially invariant within each respective sacrificial material layer 42.

Optionally, an insulating cap layer 70 can be formed over the vertical repetition (32, 42). The insulating cap layer 70 includes a dielectric material that is different from the material of the composite sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, stepped surfaces are formed at in the contact region 300 at an end portion of the vertical repetition (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical repetition (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each composite sacrificial material layer 42 other than a topmost sacrificial material layer 42 within the vertical repetition (32, 42) laterally extends farther than any overlying sacrificial material layer 42 within the vertical repetition (32, 42) in the terrace region. The terrace region includes stepped surfaces of the vertical repetition (32, 42) that continuously extend from a bottommost layer within the vertical repetition (32, 42) to a topmost layer within the vertical repetition (32, 42).

Each vertical step of the stepped surfaces can have the height of one or more pairs of an insulating layer 32 and a composite sacrificial material layer. In one embodiment, each vertical step can have the height of a single pair of an insulating layer 32 and a composite sacrificial material layer 42. In another embodiment, multiple "columns" of staircases can be formed along a first horizontal direction hd1 such that each vertical step has the height of a plurality of pairs of an insulating layer 32 and a composite sacrificial material layer 42, and the number of columns can be at least the number of the plurality of pairs. Each column of staircase can be vertically offset among one another such that each of the composite sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the composite sacrificial material layers 42 may also be employed. Each composite sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the composite sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
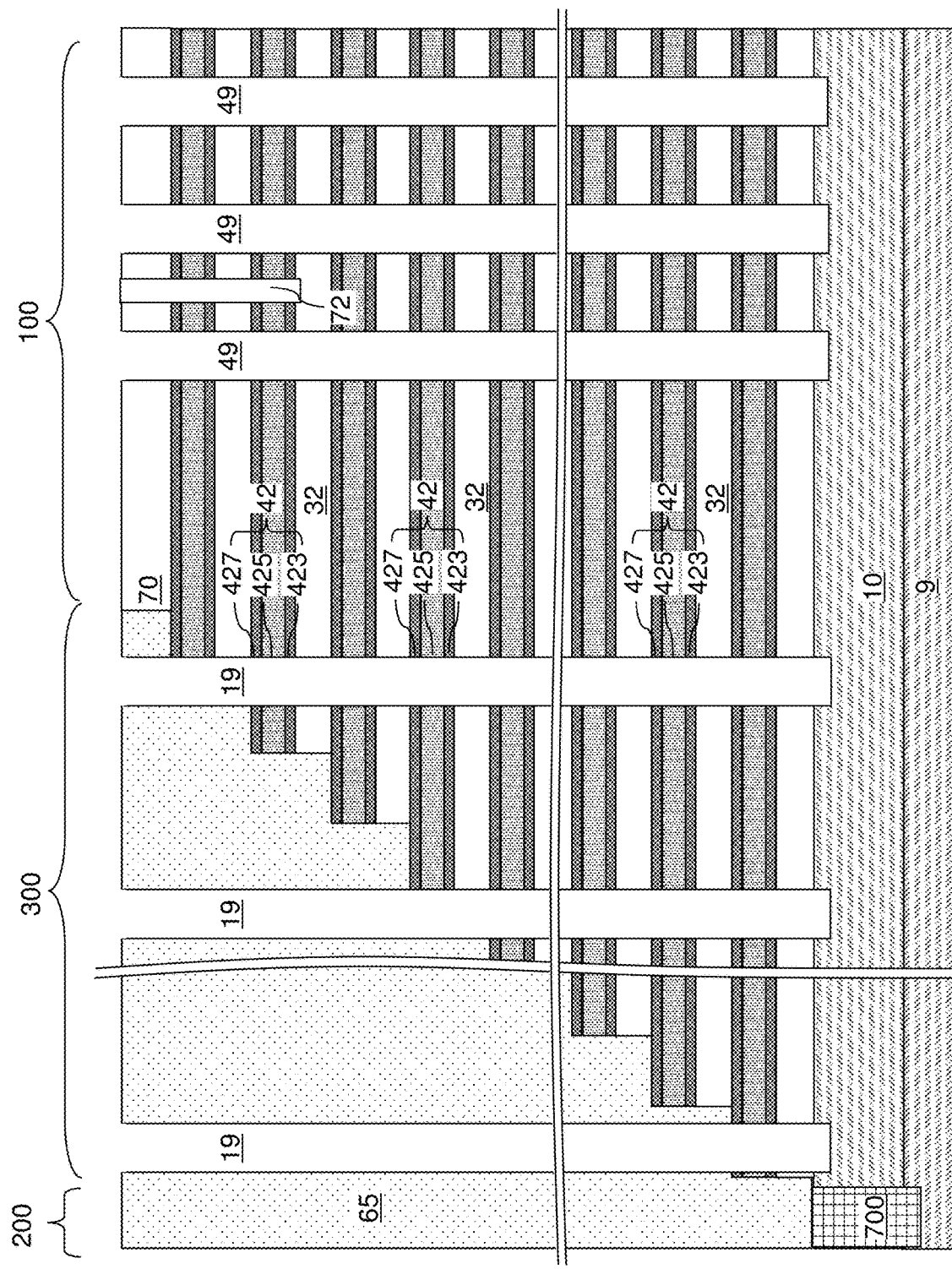
FIG. 4A is a schematic vertical cross-sectional view of the first exemplary structure after formation of memory openings and support openings according to the first embodiment of the present disclosure.
Figure 4B:
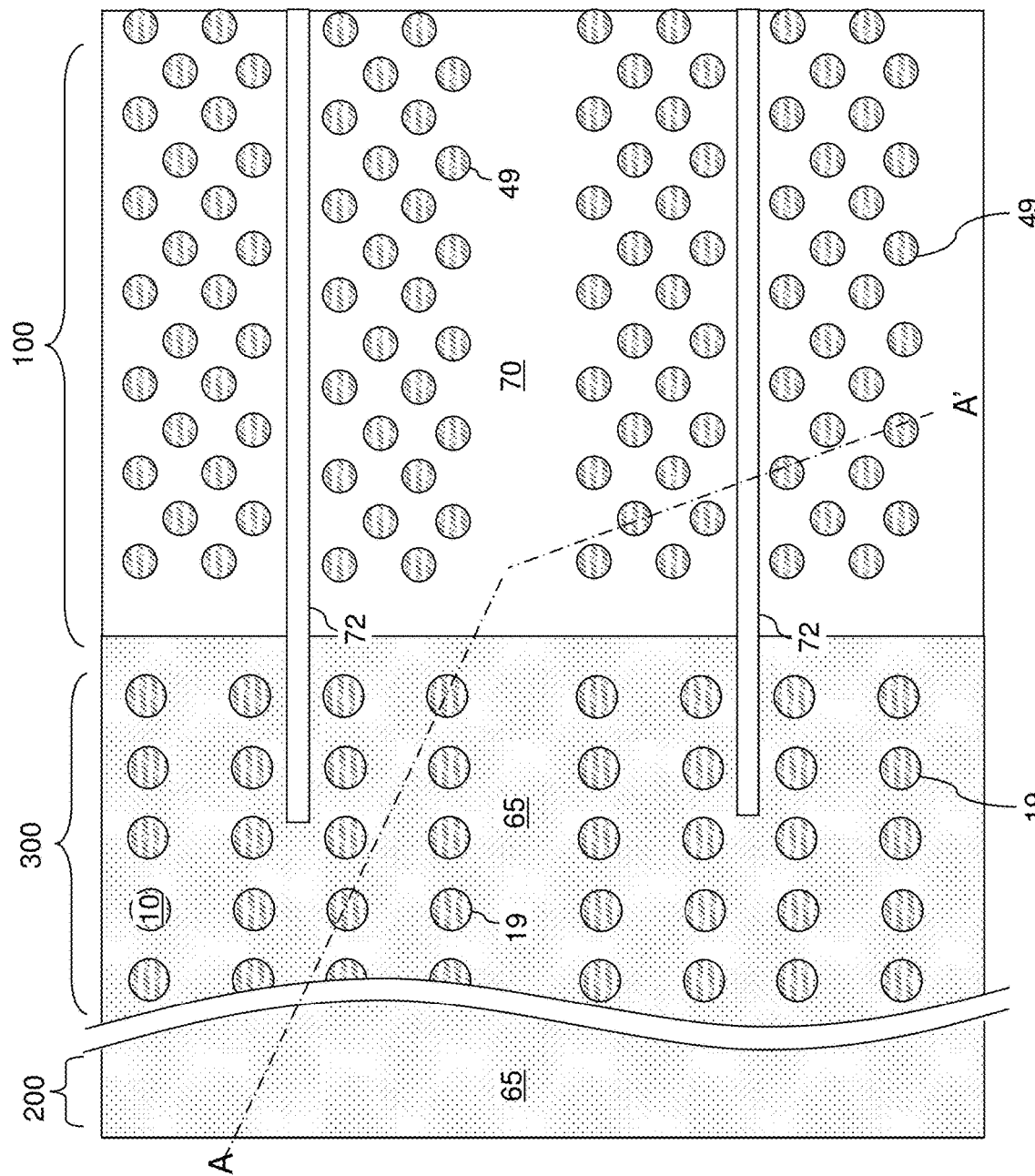
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the vertical repetition (32, 42) by at least one anisotropic etch that employs the patterned lithographic material stack as an etch mask. Portions of the vertical repetition (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the vertical repetition (32, 42) in the memory array region 100.

The support openings 19 are formed through the retro-stepped dielectric material portion 65 and the portion of the vertical repetition (32, 42) that underlie the stepped surfaces in the contact region 300. Preferably, the first, second and third sacrificial material layers (423, 425, 427) have the same or similar anisotropic etch rates.

The memory openings 49 extend through the entirety of the vertical repetition (32, 42). The support openings 19 extend through a subset of layers within the vertical repetition (32, 42). The chemistry of the anisotropic etch process employed to etch through the materials of the vertical repetition (32, 42) can alternate to optimize etching of the various materials in the vertical repetition (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical repetition (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49, which is one of the memory openings 49 in the first exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the vertical repetition (32, 42), and optionally into an upper portion of the semiconductor material layer 10. At this processing step, each support opening 19 can extend through the retro-stepped dielectric material portion 65, a subset of layers in the vertical repetition (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the composite sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a composite sacrificial material layer 42. In this case, at least one source select gate electrode can be subsequently formed by replacing each composite sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, an isotropic etch process can be performed to laterally recess the composite sacrificial material layers 42 (i.e., the first, second, and third sacrificial material layers (423, 425, 427)) selective to the insulating layers 32. For example, a solution of the isotropic etchant can be introduced into the memory openings 49 and the support openings 19. The first sacrificial material layers 423 are laterally recessed at a first etch rate, the second sacrificial material layers 425 are laterally recessed at a second etch rate that is higher than the first etch rate, and the third sacrificial material layers 427 are laterally recessed at a third etch rate that is lower than the second etch rate. The third etch rate may be the same as the first etch rate. Alternatively, the third etch rate may be different from the first etch rate. The ratio of the second etch rate to the first etch rate may be in a range from 1.1 to 10, such as from 1.5 to 3, although lesser and greater ratios may also be employed. Stepped lateral recesses 149 are formed in volumes from which the materials of the composite sacrificial material layers 42 are removed. Each stepped lateral recess 149 may have a toroidal shape that encircles a respective memory opening 49.

Each sidewall of the memory openings comprises a stepped surface between each vertically neighboring pair of the insulating layers 32. If the first sacrificial material layers 423 comprise the first silicon nitride material, the second sacrificial material layers 425 comprise the second silicon nitride material, and the third sacrificial material layers 427 comprise the first silicon nitride material, then the isotropic etchant may comprise dilute hydrofluoric acid. If the first sacrificial material layers 423 comprise a first silicon-germanium alloy, the second sacrificial material layers 425 comprise a second silicon-germanium alloy or germanium, and the third sacrificial material layers 427 comprise a third silicon-germanium material, the isotropic etchant may comprise a mixture of hydrofluoric acid and hydrogen peroxide.

Each of the first sacrificial material layers 423 can be laterally recessed by a first lateral recess distance, which can be in a range from 1 nm to 20 nm, such as from 2 nm to 10 nm, although lesser and greater lateral recess distances may also be employed. Each of the second sacrificial material layers 425 can be laterally recessed by a second lateral recess distance greater than the first lateral recess distance. The second lateral recess distance can be in a range from 3 nm to 60 nm, such as from 6 nm to 30 nm, although lesser and greater lateral recess distances may also be employed. Each of the third sacrificial material layers 427 can be laterally recessed by the first lateral recess distance, which can be in a range from 1 nm to 20 nm, such as from 2 nm to 10 nm, although lesser and greater lateral recess distances may also be employed.

Referring to FIG. 5D, a blocking dielectric layer can be optionally deposited by a conformal deposition process. The blocking dielectric layer 52 can be deposited at peripheral portions of the memory openings 49 by a conformal deposition method such as a low pressure chemical vapor deposition process or an atomic layer deposition process. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

A memory material layer 54C can be deposited as a continuous material layer by a conformal deposition process such as a chemical vapor deposition process or an atomic layer deposition process. The memory material layer 54C includes a memory material, i.e., a material that can store data by selecting a state of the material. For example, the memory material layer 54C may include a charge storage material such as silicon nitride, polysilicon, or a metallic material, a ferroelectric material that can store information in the form of a polarization direction, or any other memory material that can store data by altering electrical resistivity. The duration of deposition of the memory material layer 54C can be selected such that the entire volume of each stepped lateral recess 149 is filled with a respective portion of the memory material layer 54C. For example, the thickness of the memory material layer 54C over sidewalls of the insulating layers 32 may be greater than the thickness of a composite sacrificial material layer 42, and may be in a range from 25 nm to 60 nm, although lesser and greater thicknesses may also be employed.

Referring to FIG. 5E, portions of the memory material layer 54C that are located outside the lateral recesses can be anisotropically etched by performing an anisotropic etch process. The chemistry of the anisotropic etch process can be selected such that the anisotropic etch process etches the material of the memory material layer 54C selective to the material of the blocking dielectric layer 52. Remaining portions of the memory material layer 54C in the lateral recesses comprise a vertical stack of memory elements 54, which can be discrete memory elements 54 having a respective toroidal shape. Each discrete memory element 54 of the vertical stack of discrete memory elements 54 can be formed entirely between a vertically neighboring pair of insulating layers 32. Each memory element 54 can have a vertical extent that is not greater than, and may be less than, the thickness of a composite sacrificial material layer 42 located at a same level. Each memory element 54 has a vertical (i.e., straight) sidewall facing the memory opening 49.

Referring to FIG. 5F, a dielectric material liner 56 can be optionally formed by a conformal deposition process. In one embodiment, if each memory element 54 is a discrete charge storage element, then the dielectric material liner 56 may comprise a tunneling dielectric layer including a dielectric material through which charge tunneling can be performed under suitable electrical bias conditions. The charge tunneling may be performed through hot-carrier injection or by Fowler-Nordheim tunneling induced charge transfer depending on the mode of operation of the three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon.

The thickness of the dielectric material liner 56 can be in a range from 2 nm to 20 nm, although lesser and greater thicknesses can also be employed.

In case the dielectric material liner 56 is present, a sacrificial cover layer 601 can be optionally deposited over the dielectric material liner 56. The sacrificial cover layer 601 can include a sacrificial cover material that can be employed to protect the dielectric material liner during a subsequent anisotropic etch process. For example, the sacrificial cover layer 601 may include a semiconductor material (such as amorphous silicon), silicon oxide, amorphous carbon, or diamond-like carbon (DLC). The thickness of the sacrificial cover layer 601 may be in a range from 1 nm to 20 nm, although lesser and greater thicknesses may also be employed.

Referring to FIG. 5G, the optional sacrificial cover layer 601, the dielectric material liner 56, and the blocking dielectric layer 52 can be sequentially anisotropically etched employing at least one anisotropic etch process. The portions of the sacrificial cover layer 601, the dielectric material liner 56, and the blocking dielectric layer 52 located above the top surface of the insulating cap layer 70 can be removed by the at least one anisotropic etch process. Further, the horizontal portions of the sacrificial cover layer 601, the dielectric material liner 56, and the blocking dielectric layer 52 at a bottom of each memory cavity 49' can be removed to form openings in remaining portions thereof. Each of the sacrificial cover layer 601, the dielectric material liner 56, and the blocking dielectric layer 52 can be etched by a respective anisotropic etch process employing a respective etch chemistry, which may, or may not, be the same for the various material layers. Each remaining portion of the sacrificial cover layer 601 and the dielectric material liner 56 can have a tubular configuration.

A surface of the pedestal channel portion 11 (or a surface of the semiconductor material layer 10 in case the pedestal channel portions 11 are not employed) can be physically exposed underneath the opening through the sacrificial cover layer 601, the dielectric material liner 56, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance.

Referring to FIG. 5H, the sacrificial cover layer 601 can be removed selective to the dielectric material liner 56. Alternatively, if the sacrificial cover layer 601 comprises a semiconductor material, such as amorphous silicon, then it may be retained in the final device. An isotropic etch process or an ashing process may be employed to remove the sacrificial cover layer 601. A semiconductor channel material layer 60C can be deposited directly on the semiconductor surface of the pedestal channel portion 11 or the semiconductor material layer 10 if the pedestal channel portion 11 is omitted. The semiconductor channel material layer 60C may be deposited directly on the dielectric material liner 56 (or on the sacrificial cover layer 601 if it is retained). The semiconductor channel material layer 60C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60C includes amorphous silicon or polysilicon. The semiconductor channel material layer 60C can be formed by a conformal deposition method such as low pressure chemical vapor deposition (LPCVD). The thickness of the semiconductor channel material layer 60C can be in a range from 2 nm to 10 nm, although lesser and greater thicknesses can also be employed. The semiconductor channel material layer 60C may partially fill the memory cavity 49' in each memory opening, or may fully fill the cavity in each memory opening.

In case the memory cavity 49' in each memory opening is not completely filled by the semiconductor channel material layer 60C, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5I, the horizontal portion of the dielectric core layer 62L can be removed, for example, by a recess etch from above the top surface of the insulating cap layer 70. Further, the material of the dielectric core layer 62L located inside the memory openings 49 can be vertically recessed such that top surfaces of remaining portions of the dielectric core layer 62L are located at, or about, the horizontal plane including the bottom surface of the insulating cap layer 70. Each remaining portion of the dielectric core layer 62L constitutes a dielectric core 62. Further, the horizontal portion of the semiconductor channel material layer 60C located above the top surface of the insulating cap layer 70 can be removed by a planarization process, which can employ a recess etch or chemical mechanical planarization (CMP). Each remaining portion of the semiconductor channel material layer 60C can be located entirely within a memory opening 49 or entirely within a support opening 19.

Referring to FIG. 5J, a doped semiconductor material having a doping of a second conductivity type can be deposited in the recess regions overlying the dielectric cores 62. The doped semiconductor material can have a doping of a second conductivity type that is the opposite of the first conductivity type. For example, if the first conductivity type is p-type, the second conductivity type is n-type, and vice versa. The dopant concentration in the doped semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited doped semiconductor material and the semiconductor channel material layer 60C can be removed from above the top surface of the insulating cap layer 70, for example, by chemical mechanical planarization (CMP) or a recess etch. Each remaining portion of the doped semiconductor material having a doping of the second conductivity type constitutes a drain region 63. Each remaining portion of the semiconductor channel material layer 60C that remains in a memory opening 49 constitutes a vertical semiconductor channel 60.

Each combination of a vertical stack of memory elements 54, the optional dielectric material liner 56, and a vertical semiconductor channel 60 within a memory opening 49 constitutes a memory stack structure (54, 56, 60). The set of all material portions filling a memory opening 49 constitutes a memory opening fill structure 58, which can include an optional pedestal channel portion 11, a blocking dielectric layer 52, a memory stack structure (54, 56, 60), a dielectric core 62, and a drain region 63. The set of all material portions filling a support opening 19 constitutes a support pillar structure, which may include an optional pedestal channel portion 11, a blocking dielectric layer 52, optional memory elements 54 that are dummy memory elements (that are not electrically active), an optional dielectric material liner 56, a vertical semiconductor channel 60, a dielectric core 62, and a drain region 63 (which is a dummy drain region that is not electrically active, i.e., not electrically connected to a bit line).

Figure 5K:
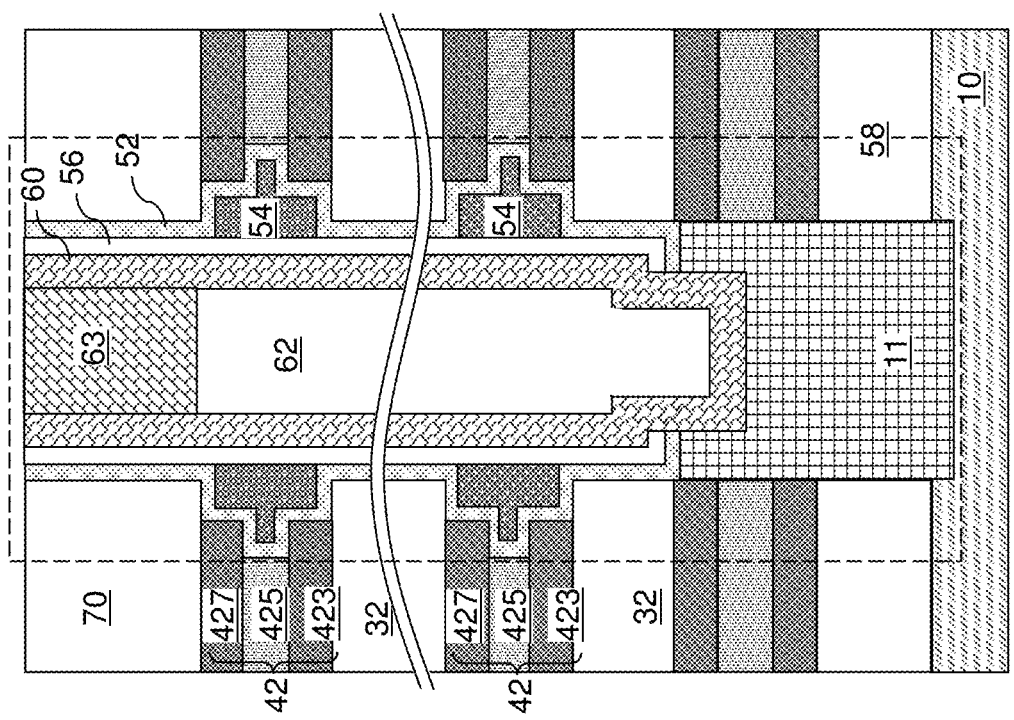
FIG. 5K is a vertical cross-sectional view of a first alternative configuration of a memory opening fill structure according to the first embodiment of the present disclosure.

FIG. 5K is a vertical cross-sectional view of a first alternative configuration of a memory opening fill structure 58 according to the first embodiment of the present disclosure. Generally, the ratios of the thicknesses of the first sacrificial material layer 423 and the third sacrificial material layer 427 relative to the thickness of the second sacrificial material layer 425 are increased to provide a stronger concentration of the electric field in the middle portion each memory element 54.

Figure 6:
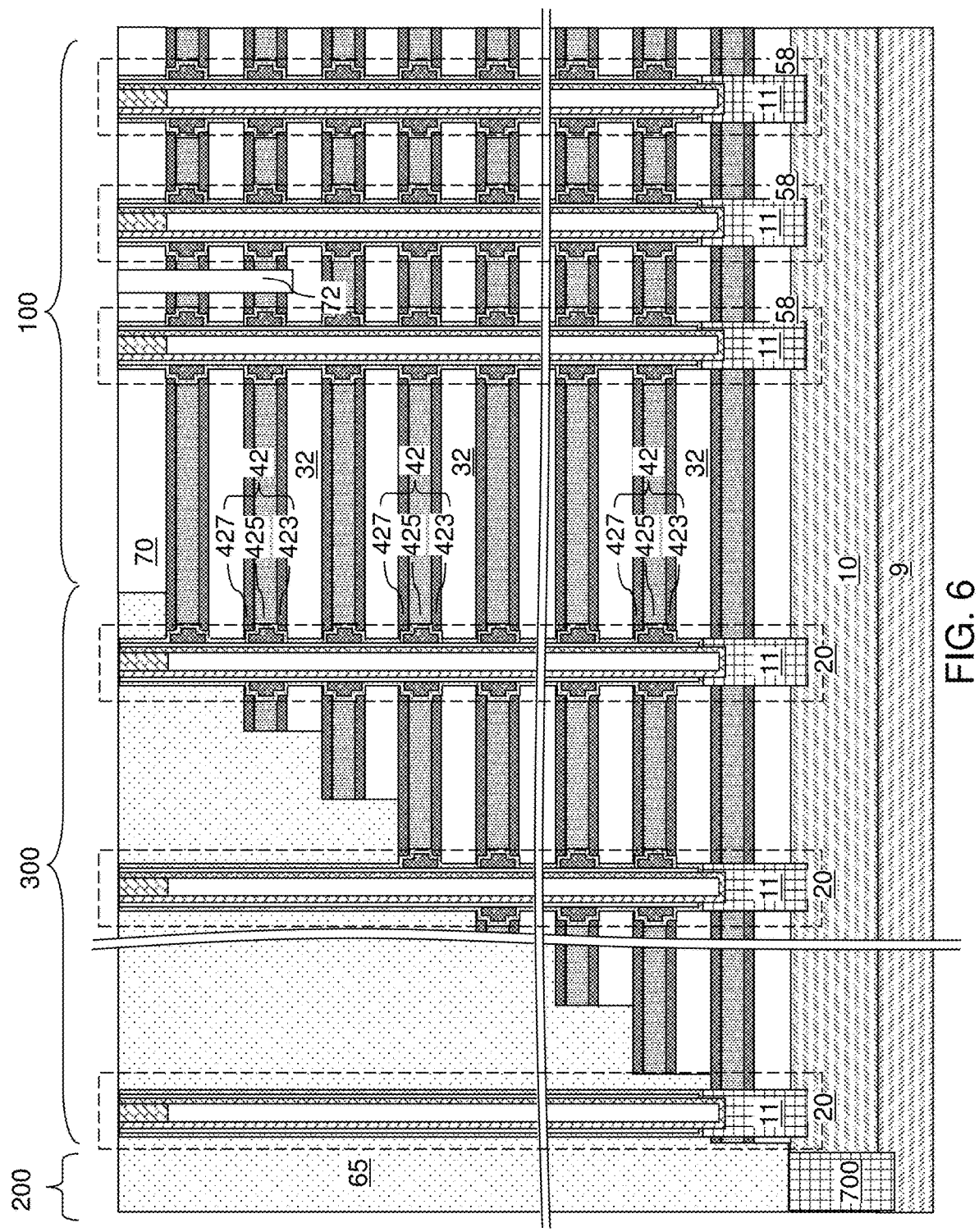
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Referring collectively to FIGS. 5J, 5K, and 6, memory opening fill structures 58 are formed in the memory openings 49. Each of the memory opening fill structures 58 comprises a vertical semiconductor channel 60, a dielectric material liner 56 laterally surrounding the vertical semiconductor channel 60, and a vertical stack of discrete (i.e., vertically separated) memory elements 54 laterally surrounding the dielectric material liner 56 and located within volumes of the lateral protrusions at peripheries of a respective memory opening 49. Each discrete memory element 54 within the vertical stack of discrete memory elements 54 comprises a vertical (i.e., straight) inner sidewall and a stepped outer sidewall that is laterally offset outward from the vertical inner sidewall by a greater lateral offset distance at a central segment thereof (which is located at a level of a second sacrificial material layer 425) than at a top segment thereof (which is located at a top end of a third sacrificial material layer 427) and than at a bottom segment thereof (which is located at a bottom end of a first sacrificial material layer 423).

In one embodiment, the stepped outer sidewall of each discrete memory element 54 comprises a stepped outer sidewall comprising a plurality of vertical outer sidewall segments (which are in contact with cylindrical surface segments of the blocking dielectric layer 52) and a plurality of horizontal outer sidewall segments (which are in contact with annular horizontal surface segments of the blocking dielectric layer 52) that are adjoined to each other.

In one embodiment, the top segment of the stepped outer sidewall of each discrete memory element 54 comprises a first one of the plurality of vertical outer sidewall segments of a respective one of the stepped outer sidewalls; the bottom segment of the stepped outer sidewall of each discrete memory element 54 comprises a second one of the plurality of vertical outer sidewall segments of the respective one of the stepped outer sidewalls; and the central segment of the stepped outer sidewall of each discrete memory element 54 comprises a third one of the plurality of vertical outer sidewall segments of the respective one of the stepped outer sidewalls. Each of the top segment of the stepped outer sidewall of each discrete memory element 54, the bottom segment of the stepped outer sidewall of each discrete memory element 54, and the central segment of the stepped outer sidewall of each discrete memory element 54 may comprise a respective cylindrical surface segment of a respective discrete memory element 54.

In one embodiment, the first sacrificial material layers 423 and the third sacrificial material layers 427 may have the same material composition, and the first one and the third second one of the plurality of vertical outer sidewall segments can be equidistant from the vertical semiconductor channel 60.

In one embodiment, each memory opening fill structure 58 may comprise a blocking dielectric layer 52 in contact with an entirety of the convex or stepped outer sidewalls of the vertical stack of discrete memory elements 54. In one embodiment, all surfaces of the vertical stack of discrete memory elements 54 are in direct contact with a respective surface of the surfaces of the blocking dielectric layer 52 and the dielectric material liner 56.

Figure 7A:
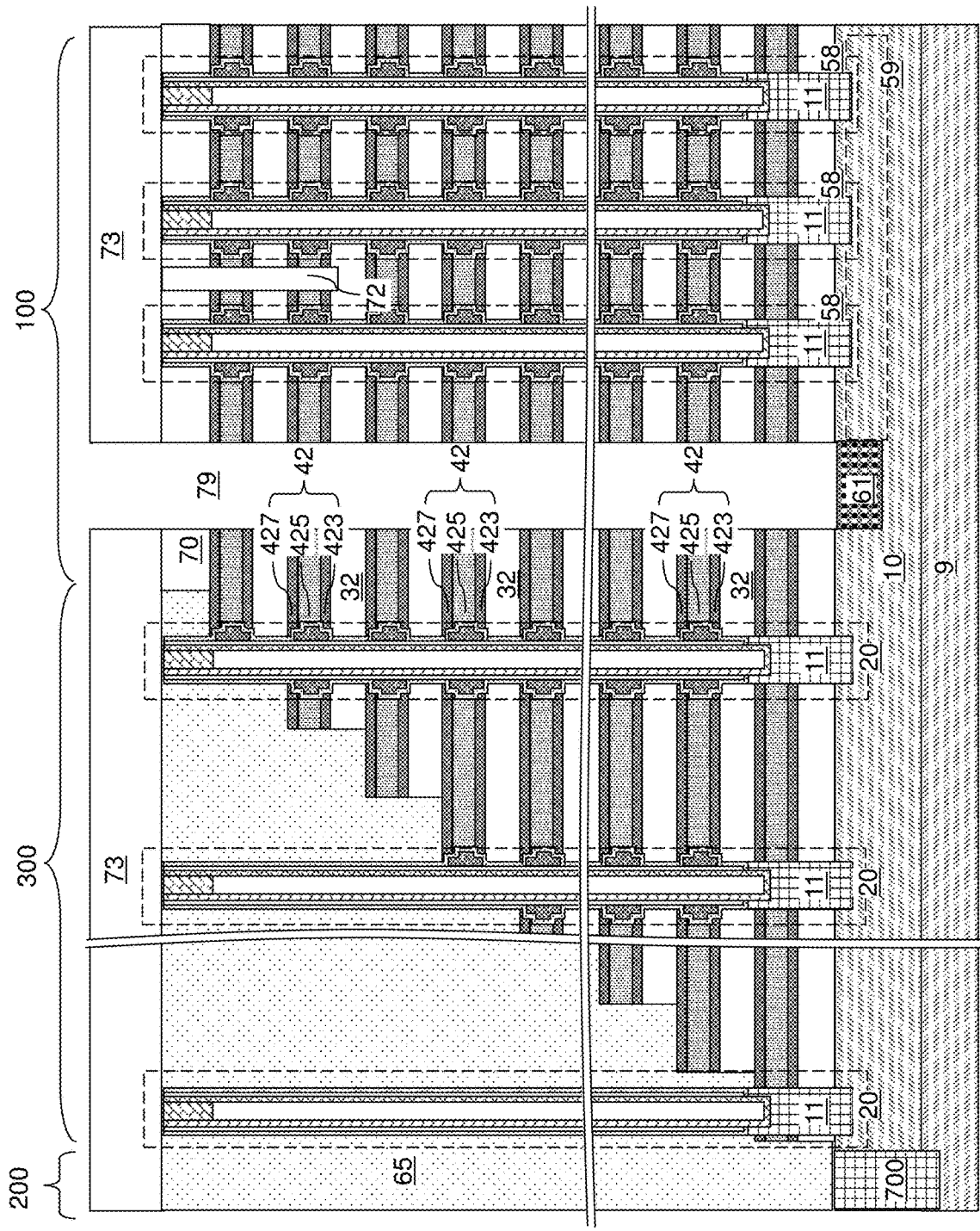
FIG. 7A is a schematic vertical cross-sectional view of the first exemplary structure after formation of backside trenches according to the first embodiment of the present disclosure.

Referring to FIGS. 7A and 7B, a contact level dielectric layer 73 can be formed over the vertical repetition (32, 42) of insulating layer 32 and composite sacrificial material layers 42, and over the memory opening fill structures 58 and the support pillar structures 20. The contact level dielectric layer 73 includes a dielectric material that is different from the dielectric material of the composite sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the vertical repetition (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The memory opening fill structures 58 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory opening fill structures 58 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. Each source region 61 is formed in a surface portion of the semiconductor material layer 10 that underlies a respective backside trench 79. An upper portion of the semiconductor material layer 10 that extends between the source region 61 and the memory opening fill structures 58 constitutes a horizontal semiconductor channel 59. Alternatively, a horizontal semiconductor source strap (e.g., direct strap contact) may be formed in contact with a sidewall of the vertical semiconductor channel 60 in place of the source region 61 and the horizontal semiconductor channel 59.

Figure 8:
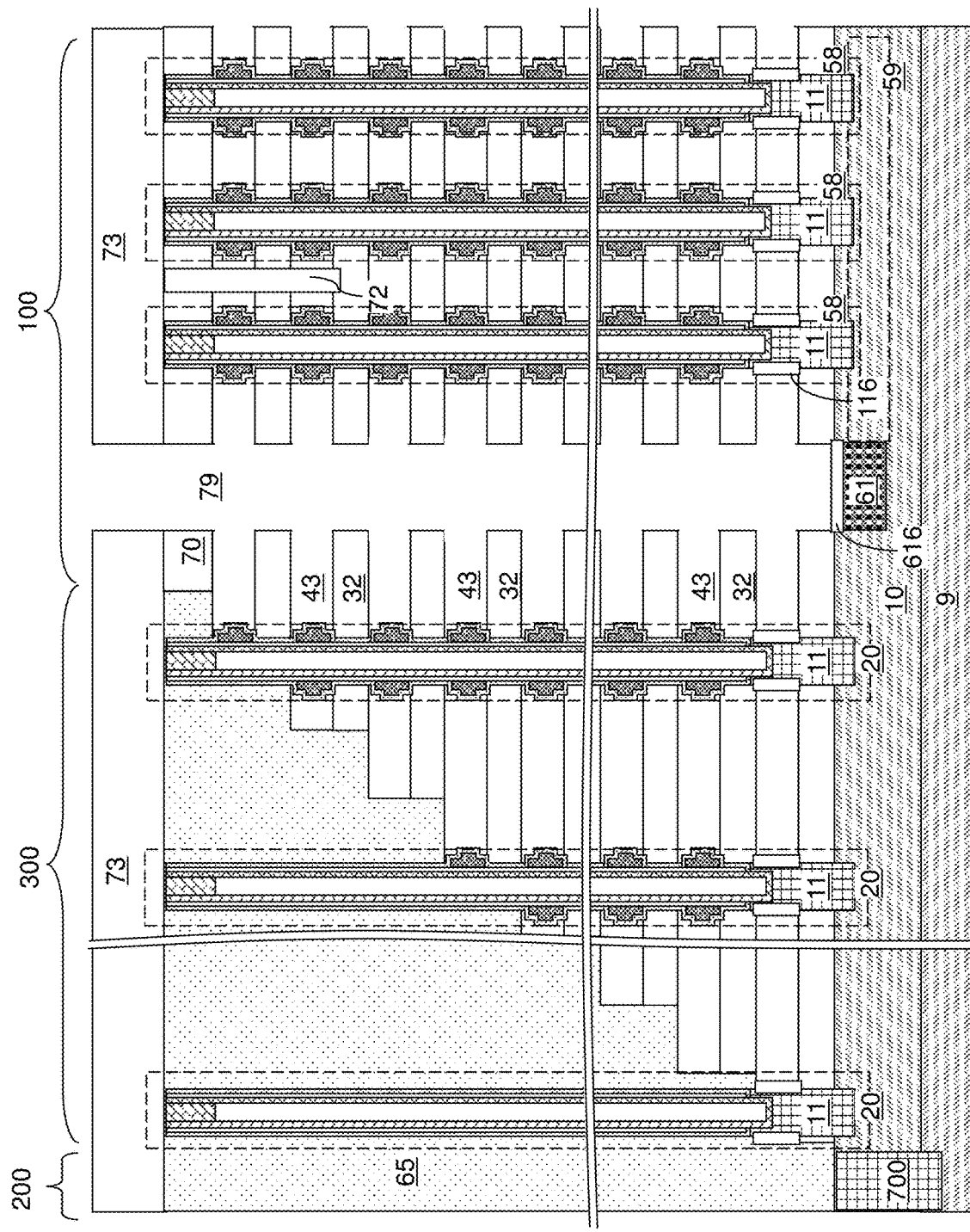
FIG. 8 is a schematic vertical cross-sectional view of the first exemplary structure after formation of backside recesses according to the first embodiment of the present disclosure.

Referring to FIG. 8, an etchant that selectively etches the materials of the composite sacrificial material layers 42 with respect to the material of the insulating layers 32 can be introduced into the backside trenches 79, for example, employing an isotropic etch process. Each of the first, second, and third sacrificial material layers (423, 425, 427) can be removed by the isotropic etch process. Backside recesses 43 are formed in volumes from which the composite sacrificial material layers 42 are removed. The removal of the materials of the composite sacrificial material layers 42 can be selective to the material of the insulating layers 32, the material of the retro-stepped dielectric material portion 65, the semiconductor material of the semiconductor material layer 10, and the material of the blocking dielectric layer 52. In one embodiment, the composite sacrificial material layers 42 can include silicon nitride, and the materials of the insulating layers 32 and the retro-stepped dielectric material portion 65 can be selected from silicon oxide and dielectric metal oxides.

The etch process that removes the composite sacrificial material layers 42 selective to the insulating layers 32 and the blocking dielectric layer 52 can be a wet etch process employing a wet etch solution, or can be a gas phase (dry) etch process in which the etchant is introduced in a vapor phase into the backside trenches 79. For example, if the composite sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the composite sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the materials of the composite sacrificial material layers 42 is removed. The memory openings in which the memory opening fill structures 58 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9A:
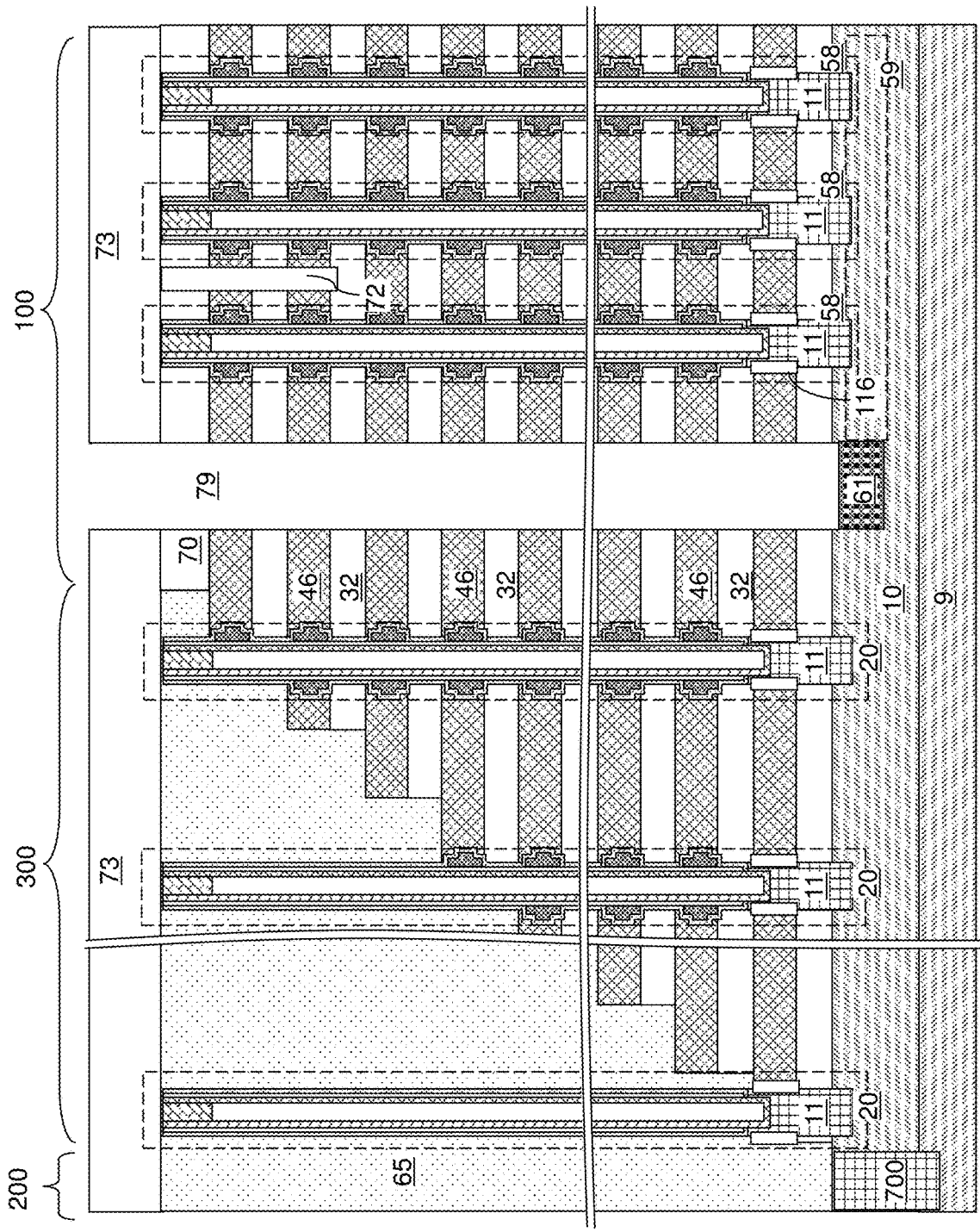
FIG. 9A is a vertical cross-sectional views of the first exemplary structure during formation of electrically conductive layers according to the first embodiment of the present disclosure.
Figure 9B:
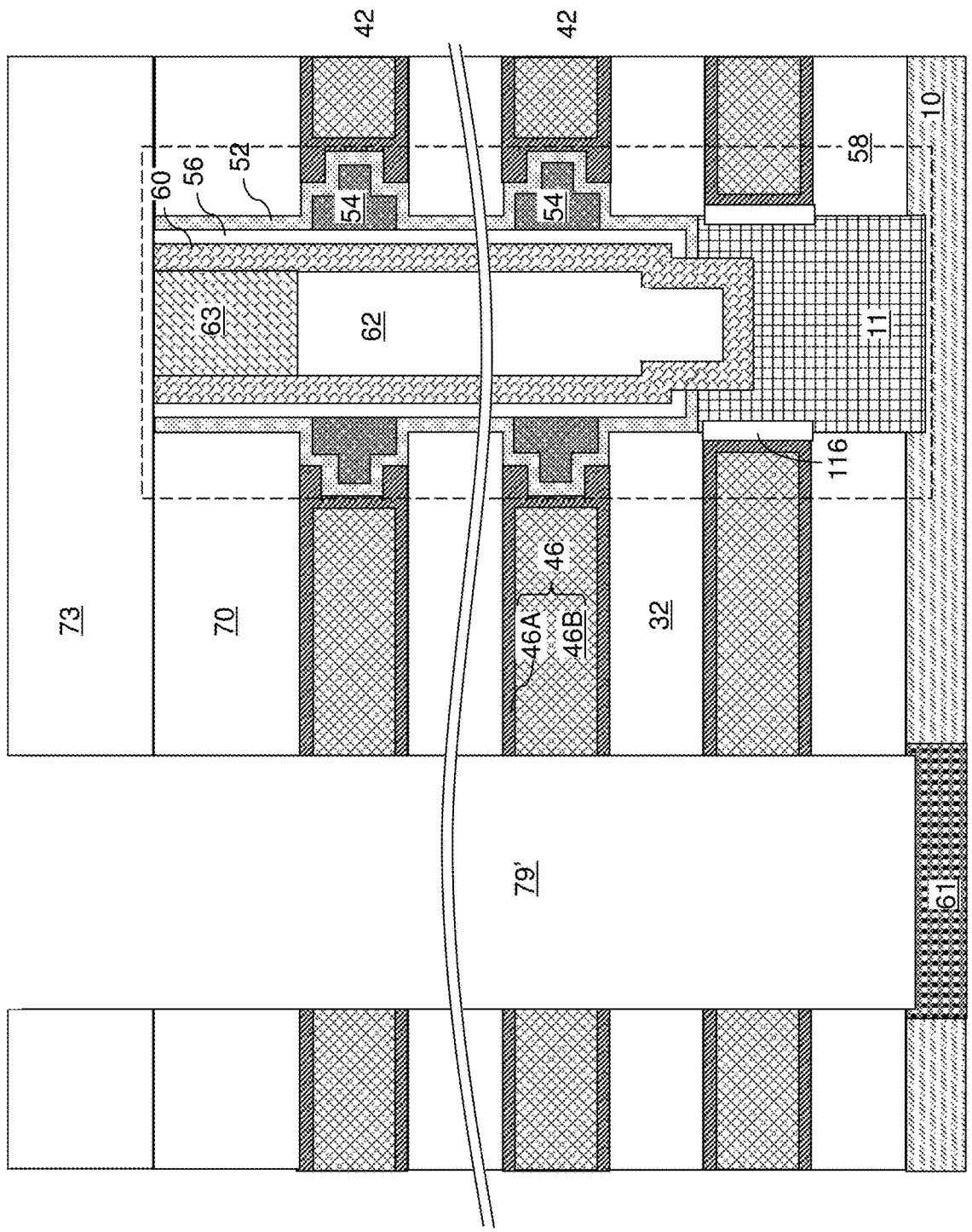
FIG. 9B is a magnified view of a portion of the first exemplary structure of FIG. 9A.

Referring to FIGS. 9A and 9B, at least one metallic material can be deposited in each of the backside recesses 43. For example, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material can be deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory opening fill structures 58 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer (which is a temporary structure and is not illustrated) can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32.

Each composite sacrificial material layer 42 can be replaced with an electrically conductive layer 46. A backside cavity is present in each backside trench 79 that is not filled with the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the composite sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory opening fill structures 58. In other words, each electrically conductive layer 46 can be a word line that functions as a common control gate electrode for the plurality of vertical memory devices.

The planar dielectric portions 616 can be removed during removal of the continuous electrically conductive material layer. A backside cavity 79' is present within each backside trench 79. The first, second, and third sacrificial material layers (423, 425, 427) are replaced with the electrically conductive layers 46.

Figure 10:
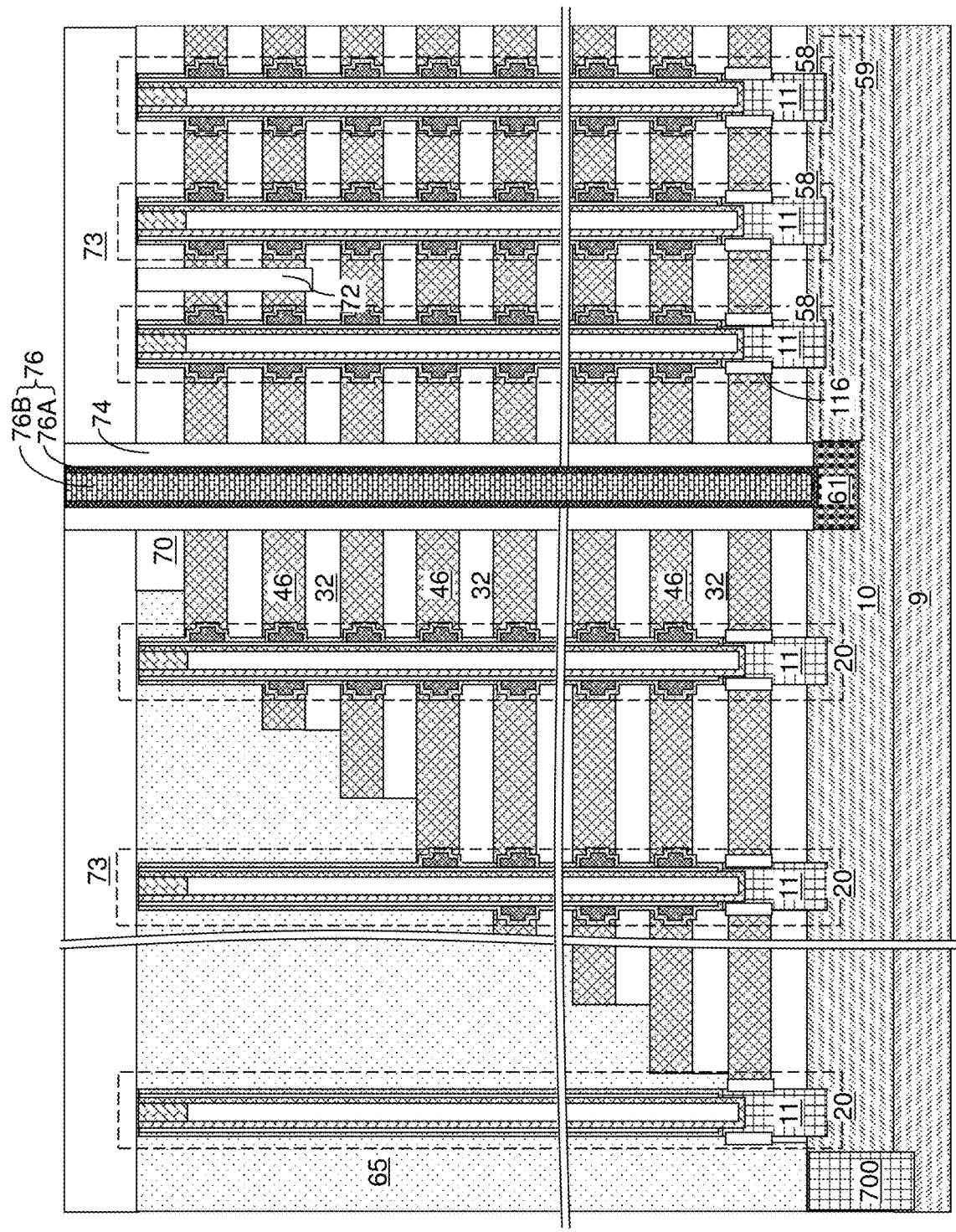
FIG. 10 is a schematic vertical cross-sectional view of the first exemplary structure after formation of an insulating spacer and a backside contact structure in each backside trench according to the first embodiment of the present disclosure.

Referring to FIG. 10, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 11A:
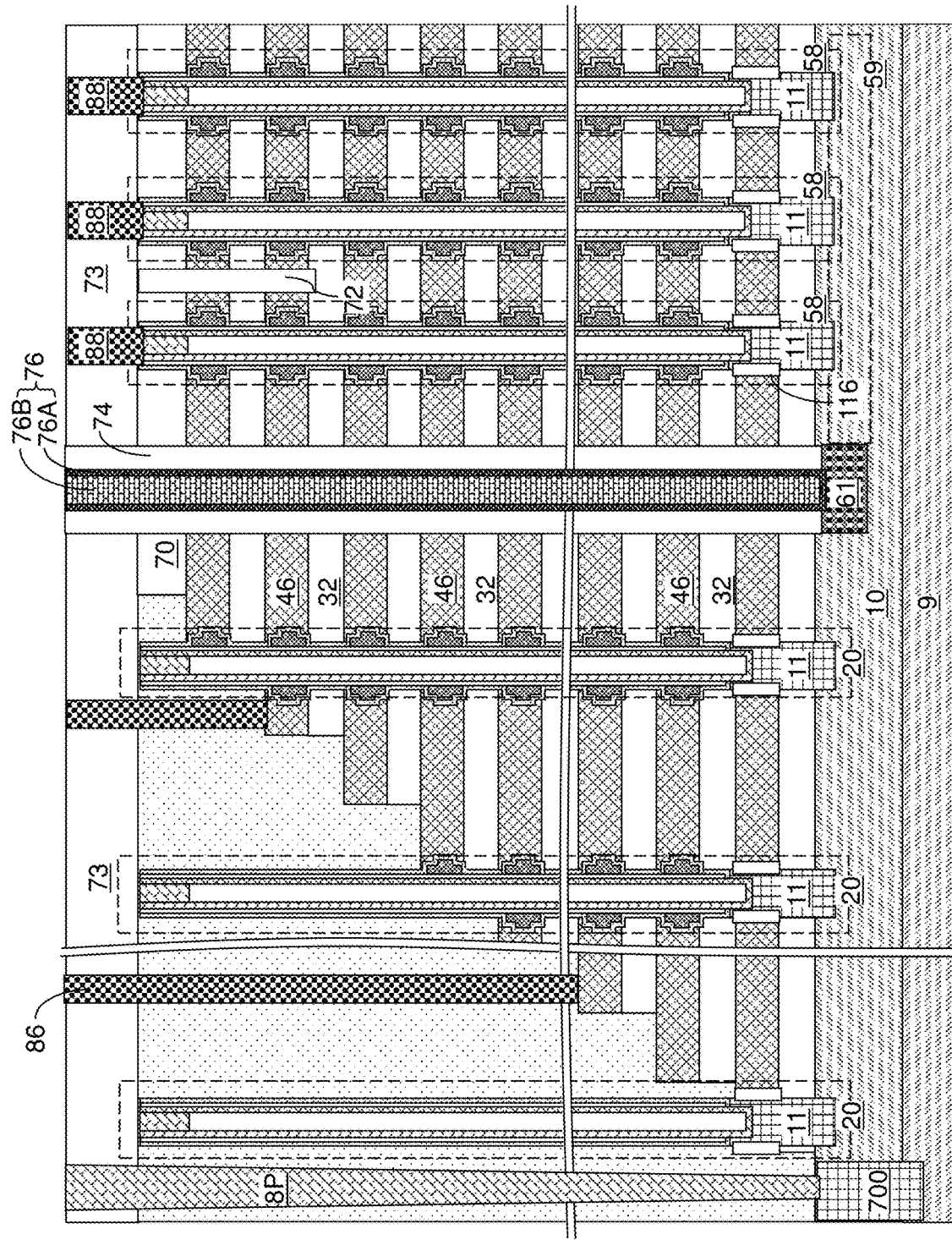
FIG. 11A is a schematic vertical cross-sectional view of the first exemplary structure after formation of additional contact via structures according to the first embodiment of the present disclosure.
Figure 11B:
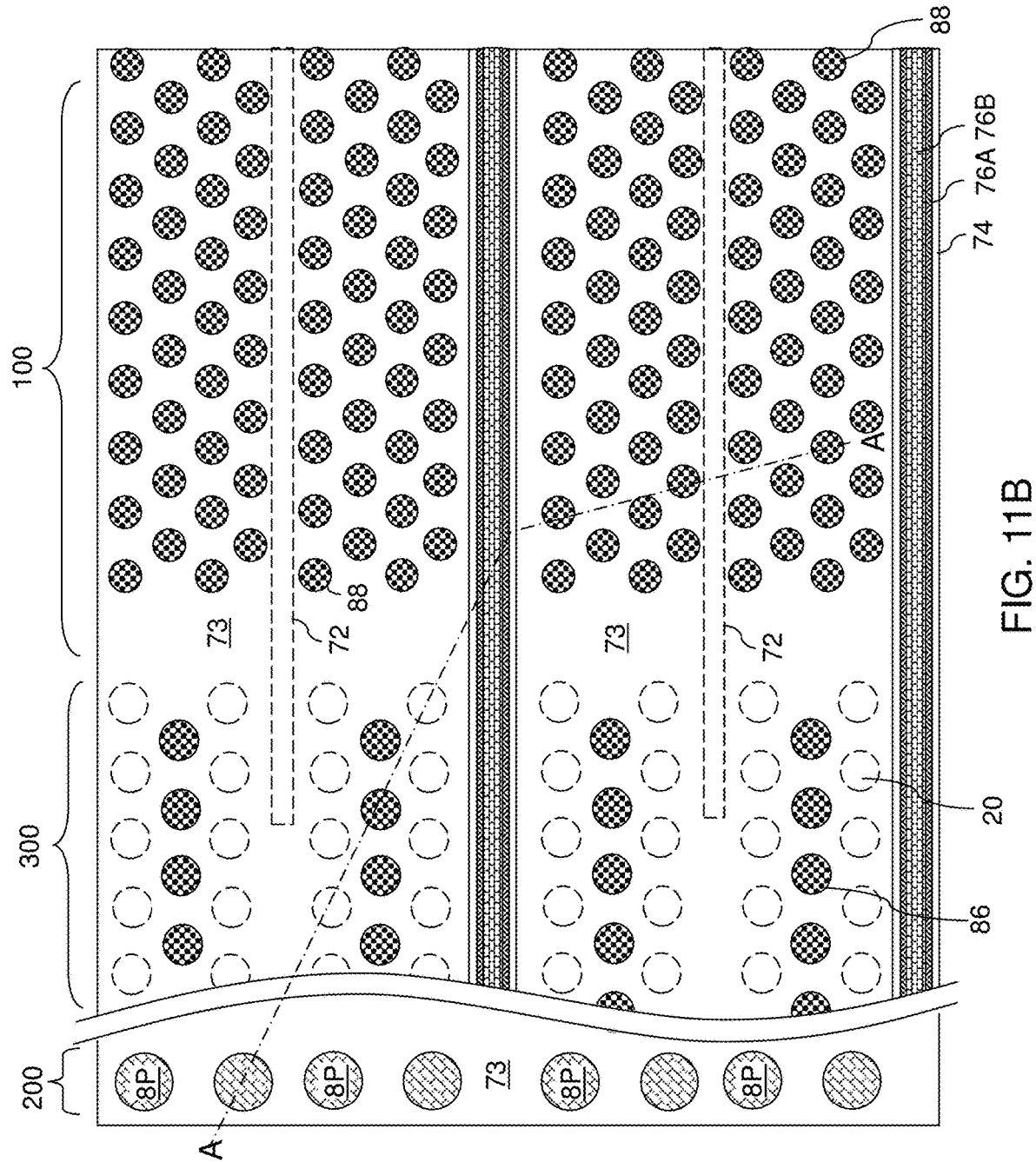
FIG. 11B is a top-down view of the first exemplary structure of FIG. 11A. The vertical plane A-A' is the plane of the schematic vertical cross-sectional view of FIG. 11A.
Figure 11C:
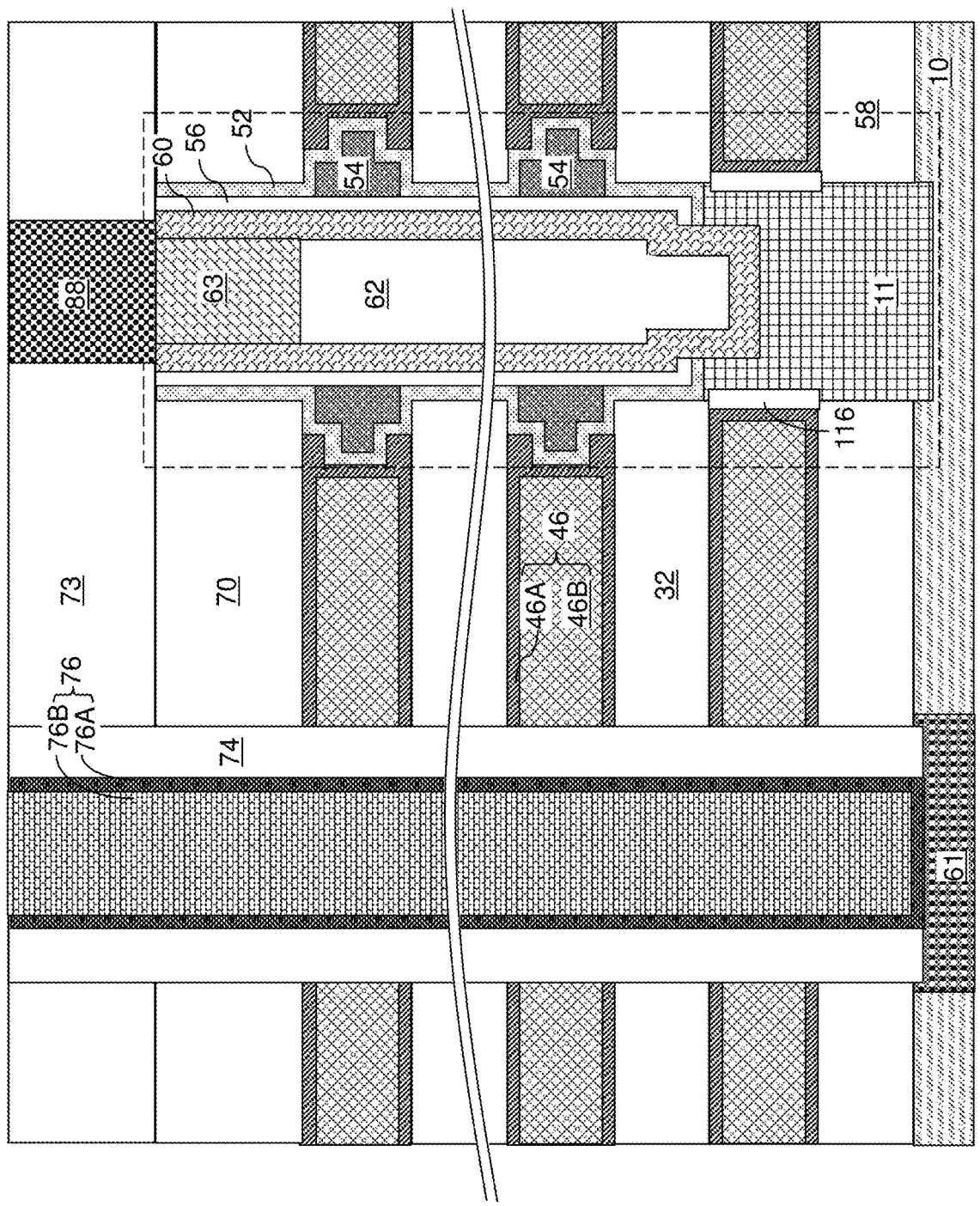
FIG. 11C is a magnified view of a region of the first exemplary structure of FIG. 11A.

Referring to FIGS. 11A-11C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 12:
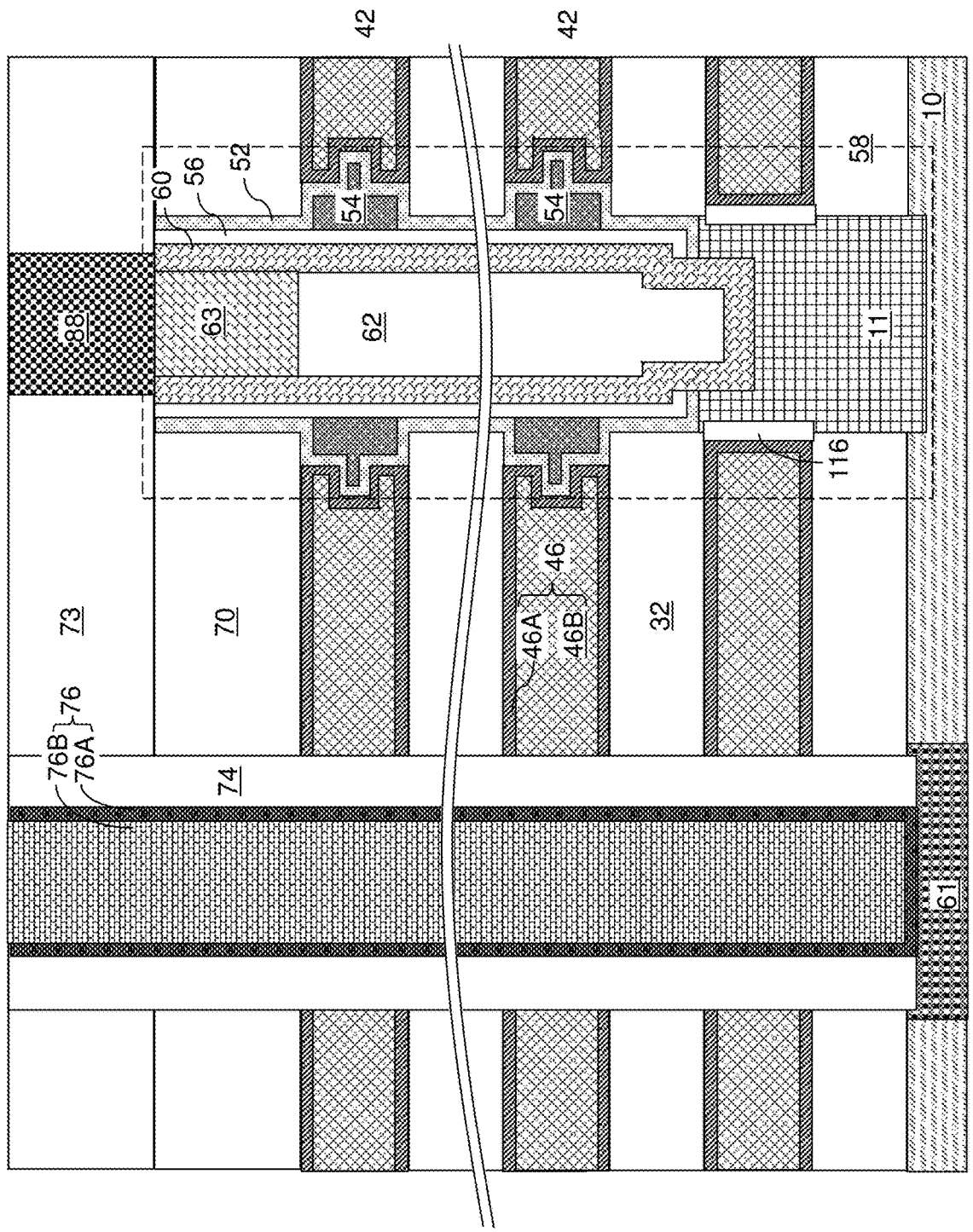
FIG. 12 is a magnified view of a region of the first alternative configuration of the first exemplary structure according to the first embodiment of the present disclosure.

Referring to FIG. 12, a region of the first alternative configuration of the first exemplary structure according to the first embodiment of the present disclosure is illustrated. Generally, the first alternative configuration of the first exemplary structure can be derived from the first exemplary structure of FIGS. 11A-11C by employing the first alternative configuration for the memory opening fill structure 58 illustrated in FIG. 5K. As discussed above, the ratios of the thicknesses of a first sacrificial material layer 423, a second sacrificial material layer 425, and a third sacrificial material layer 427 within a composite sacrificial material layer 42 can be selected to provide an optimal vertical cross-sectional profile for each memory element 54. Thus, the vertical cross-sectional profile of each memory element 54 can be selected to increase the electrical field at the tip each memory element 54 that protrude outward from a respective one of the vertical semiconductor channels 60.

Figure 13:
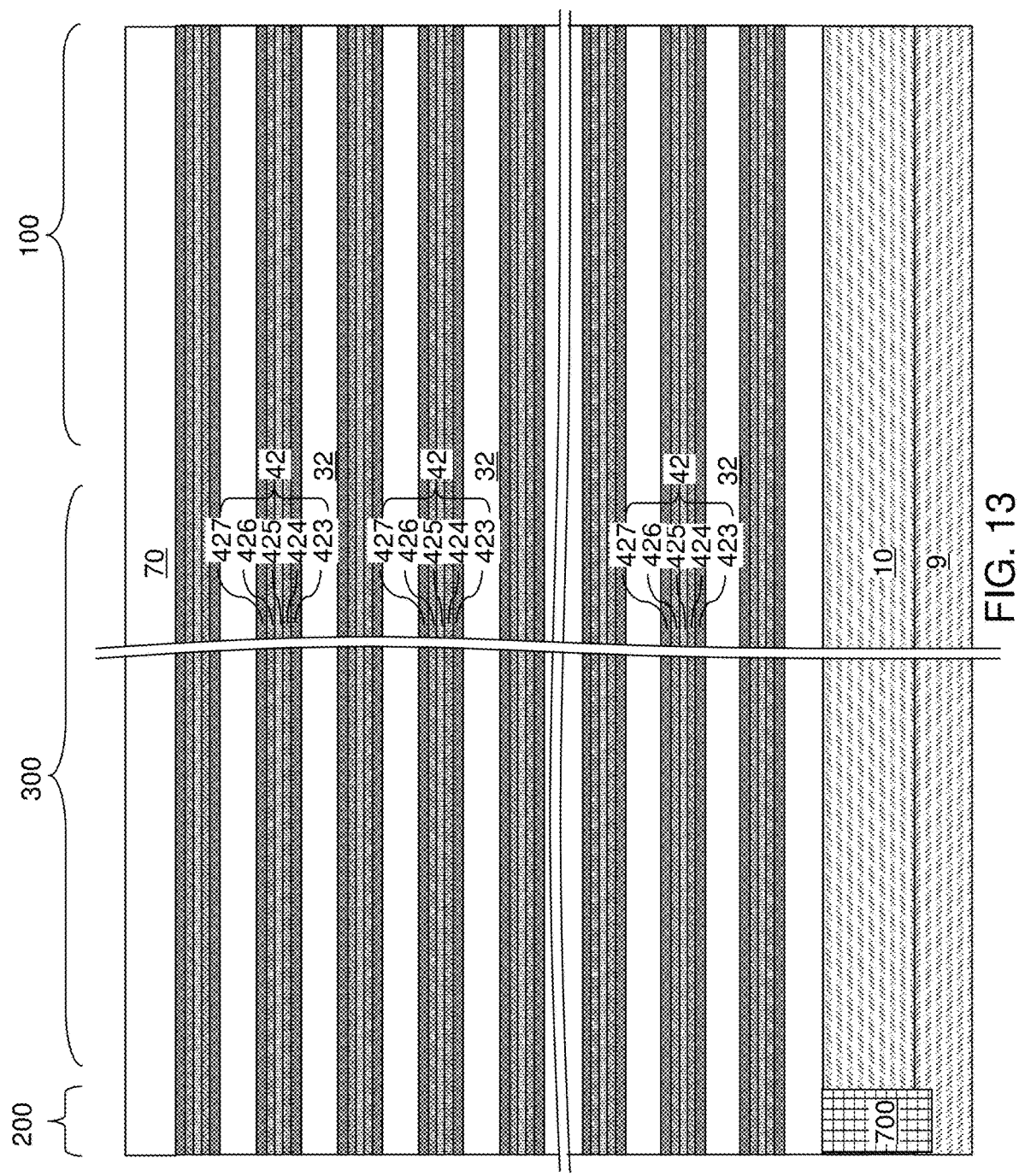
FIG. 13 is a vertical cross-sectional view of a second alternative configuration of the first exemplary structure after formation of a vertical repetition of a unit layer stack according to the first embodiment of the present disclosure.

Referring to FIG. 13, a second alternative configuration of the first exemplary structure can be derived from the first exemplary structure of FIG. 2 by modifying each composite sacrificial material layer 42 to include at least one additional sacrificial material layer (424, 426). For example, a first additional sacrificial material layer 424 may be inserted between the first sacrificial material layer 423 and the second sacrificial material layer 425, and a second additional sacrificial material layer 426 may be inserted between the second sacrificial material layer 425 and the third sacrificial material layer 427.

In a first non-limiting illustrative example, the first and second additional sacrificial material layers (424, 426) can comprise, and/or can consist essentially of, a fourth silicon nitride material having a density higher than the density of the second silicon nitride material and lower than the density of the first and third silicon nitride materials. In other words, the first and second additional sacrificial material layers (424, 426) are less porous than the second sacrificial material layer 425, but more porous than the first and third sacrificial material layers (423, 427).

In a second non-limiting illustrative example, the first sacrificial material layers 423 can comprise, and/or can consist essentially of, a first silicon-germanium alloy including germanium atoms at a first atomic concentration. In this case, the material composition of the first sacrificial material layers 423 may be $Si_{1-\alpha 1}Ge_{\alpha 1}$, in which $\alpha 1$ is in a range from 0 to 0.1. The first silicon-germanium alloy may be deposited, for example, by plasma-enhanced physical vapor deposition. The second sacrificial material layers 425 can comprise, and/or can consist essentially of, a second silicon-germanium alloy or germanium including germanium atoms at a second atomic concentration. The material composition of the second sacrificial material layers 425 may be $Si_{1-\alpha 2}Ge_{\alpha 2}$, in which $\alpha 2$ is in a range from 0.5 to 1. The second silicon-germanium alloy may be deposited, for example, by plasma-enhanced physical vapor deposition. The third sacrificial material layers 427 can comprise, and/or can consist essentially of, a third silicon-germanium alloy including germanium atoms at a third atomic concentration. The material composition of the third sacrificial material layers 427 may be $Si_{1-\alpha 3}Ge_{\alpha 3}$, in which $\alpha 3$ is in a range from 0 to 0.1. The third silicon-germanium alloy may be deposited, for example, by plasma-enhanced physical vapor deposition. The first additional sacrificial material layers 424 can comprise, and/or can consist essentially of, a fourth silicon-germanium alloy including germanium atoms at a fourth atomic concentration that is greater than the first atomic concentration and is less than the second atomic concentration. The material composition of the first additional sacrificial material layers 424 may be $Si_{1-\alpha 4}Ge_{\alpha 4}$, in which $\alpha 4$ is greater than $\alpha 1$ and is less than $\alpha 2$. The fourth silicon-germanium alloy may be deposited, for example, by plasma-enhanced physical vapor deposition. The second additional sacrificial material layers 426 can comprise, and/or can consist essentially of, a fifth silicon-germanium alloy including germanium atoms at a fifth atomic concentration that is greater than the third atomic concentration and is less than the second atomic concentration. The material composition of the second additional sacrificial material layers 426 may be $Si_{1-\alpha 5}Ge_{\alpha 5}$, in which $\alpha 5$ is greater than $\alpha 3$ and is less than $\alpha 2$. For example, $\alpha 4$ and $\alpha 5$ may be in a range from 0.15 to 0.45. The fifth silicon-germanium alloy may be deposited, for example, by plasma-enhanced physical vapor deposition. In this case, the isotropic etchant may comprise a mixture of hydrofluoric acid and hydrogen peroxide.

Figure 14:
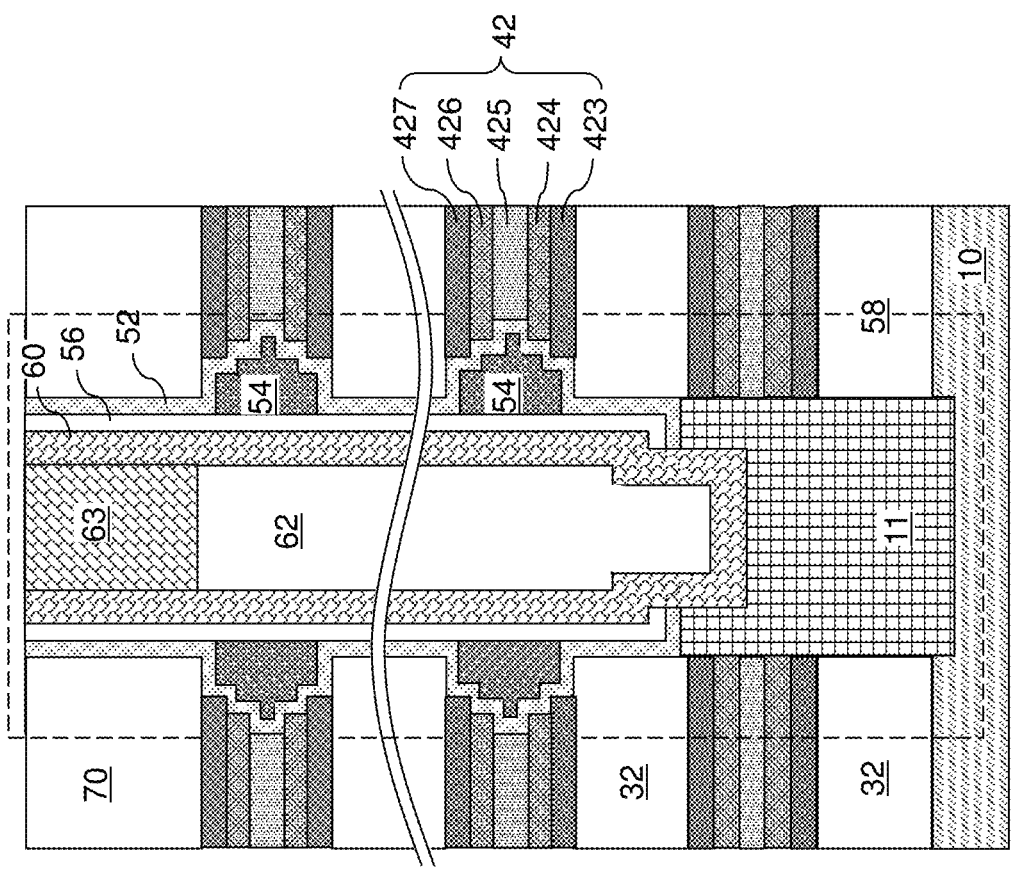
FIG. 14 is a vertical cross-sectional view of a memory opening fill structure in the second alternative configuration of the first exemplary structure at a processing steps that corresponds to the processing step of FIG. 6.

Subsequently, the processing steps of FIGS. 3, 4A and 4B, and 5A-5J can be performed. Referring to FIG. 14, a region of the second configuration of the first exemplary structure is illustrated at the processing steps of FIGS. 5J and 6.

Figure 15:
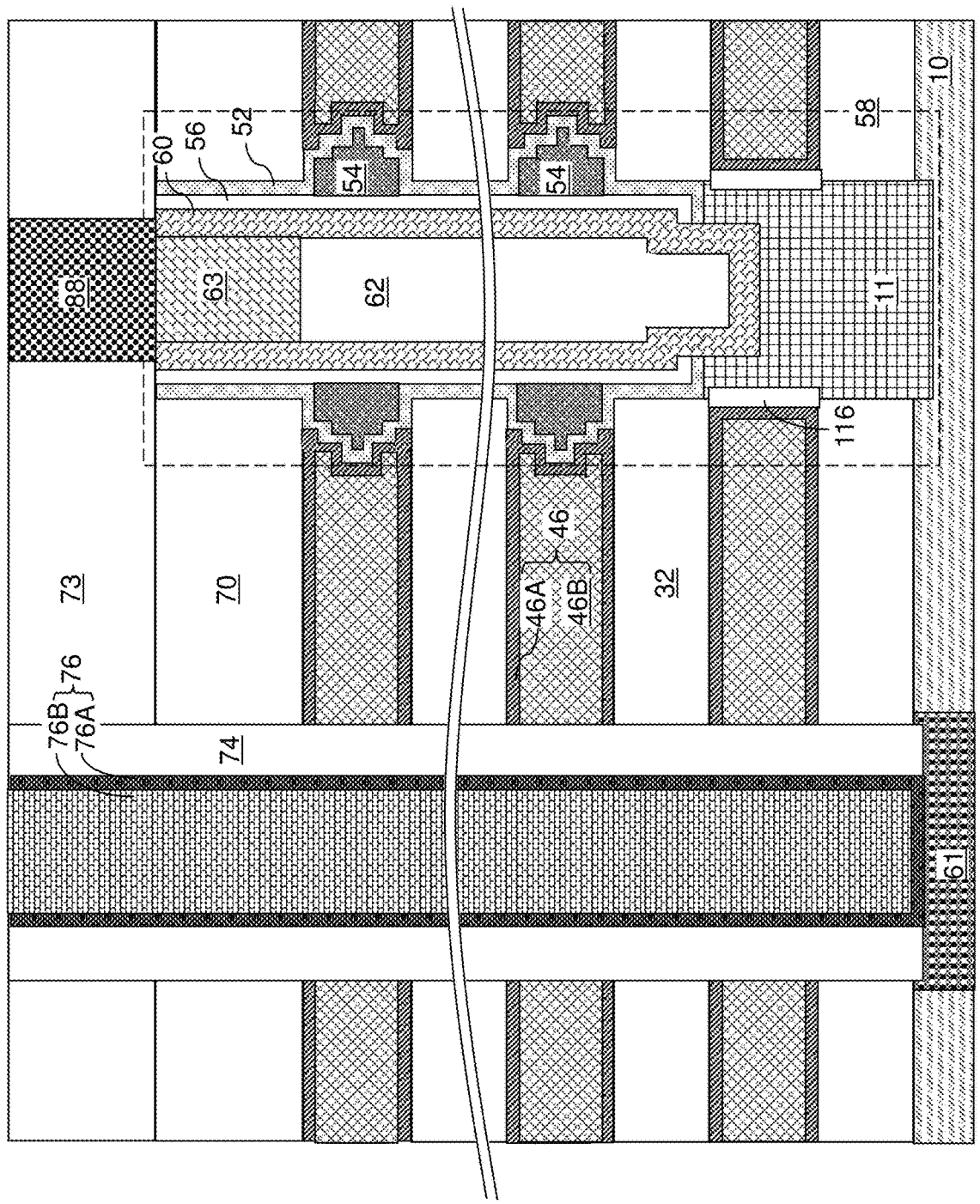
FIG. 15 is a vertical cross-sectional view of a region of the second alternative configuration of the first exemplary structure at the processing steps of FIGS. 11A-11C.

Subsequently, the processing steps of FIGS. 7A and 7B, 8, 9A and 9B, 10, and 11A-11C can be performed. Referring to FIG. 15, a region of the second configuration of the first exemplary structure is illustrated at the processing steps of FIGS. 11A-11C.

Figure 16:
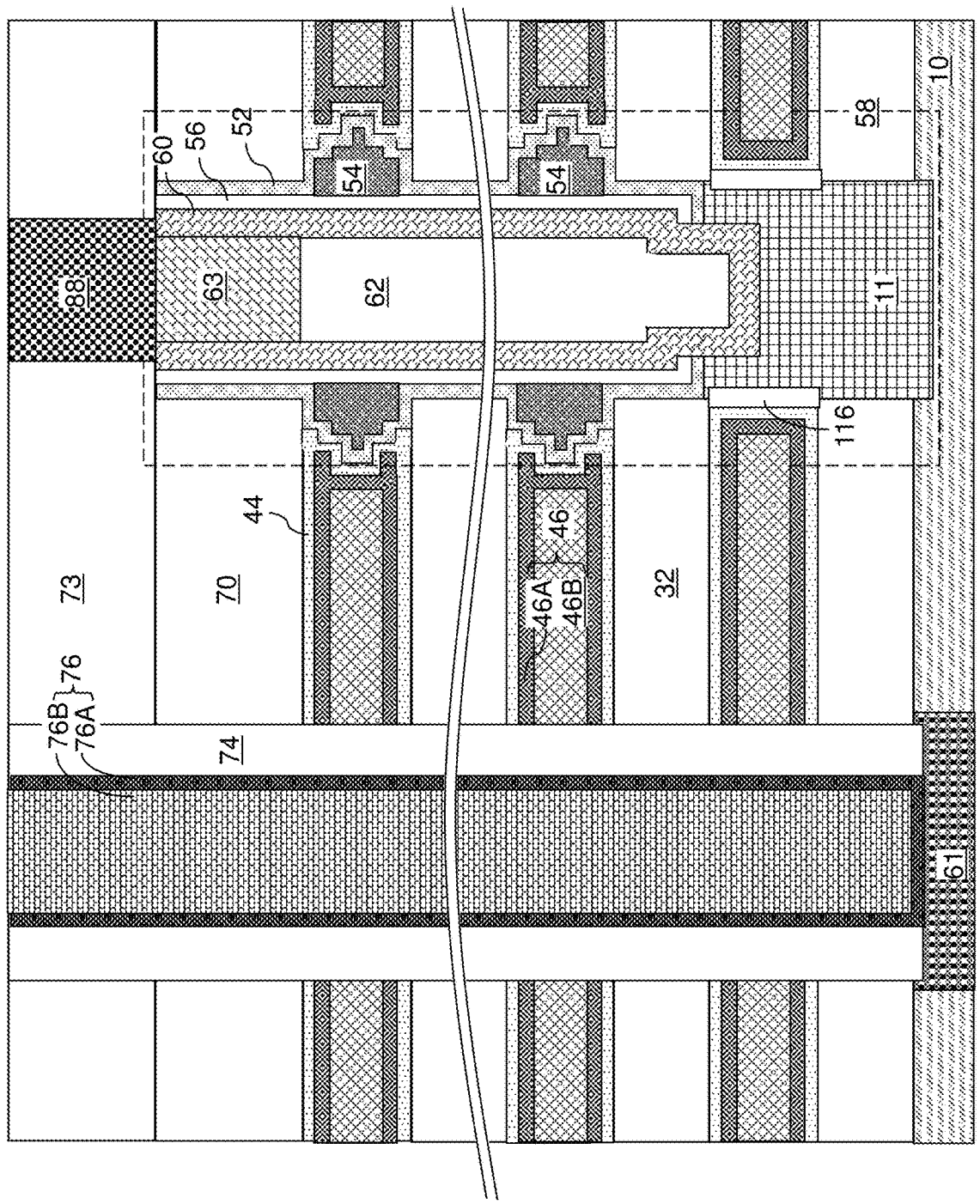
FIG. 16 is a vertical cross-sectional view of a region of a third alternative configuration of the first exemplary structure at the processing steps of FIGS. 11A-11C.

Referring to FIG. 16, a region of a third alternative configuration of the first exemplary structure is illustrated at the processing steps of FIGS. 11A-11C. The third alternative configuration of the first exemplary structure can be derived from any configuration of the first exemplary structure described above by forming a backside blocking dielectric layer 44 in each backside recess 43 directly on physically exposed surfaces of the blocking dielectric layers 52.

The backside blocking dielectric layer 44 comprises a dielectric material that functions as a portion of a control gate dielectric for the electrically conductive layers 46, which function as control gates of the vertical NAND strings formed in the memory openings 49. In case the blocking dielectric layer 52 is present within each memory opening, the backside blocking dielectric layer 44 is optional. In case the blocking dielectric layer 52 is omitted, the backside blocking dielectric layer 44 is present.

In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed. The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The electrically conductive layers 46 are subsequently formed by deposition of at least one metallic material on the backside blocking dielectric layer 44. Portions of the backside blocking dielectric layer 44 within the backside trenches 79 may be optionally removed during subsequent removal of portions of the at least one metallic material of the electrically conductive layers 46 from inside the backside trenches 79.

Referring collectively to FIGS. 11A-11C, 12, 15, and 16, in one embodiment, the plurality of vertical outer sidewall segments of each stepped outer sidewall comprises at least five vertical outer sidewall segments that are laterally offset from the vertical semiconductor channel 60 by at least three different lateral offset distances (as illustrated in FIGS. 15 and 16), and the plurality of horizontal outer sidewall segments of each stepped outer sidewall comprises at least six horizontal outer sidewall segments that are vertically spaced from the substrate by different vertical distances.

Figure 17:
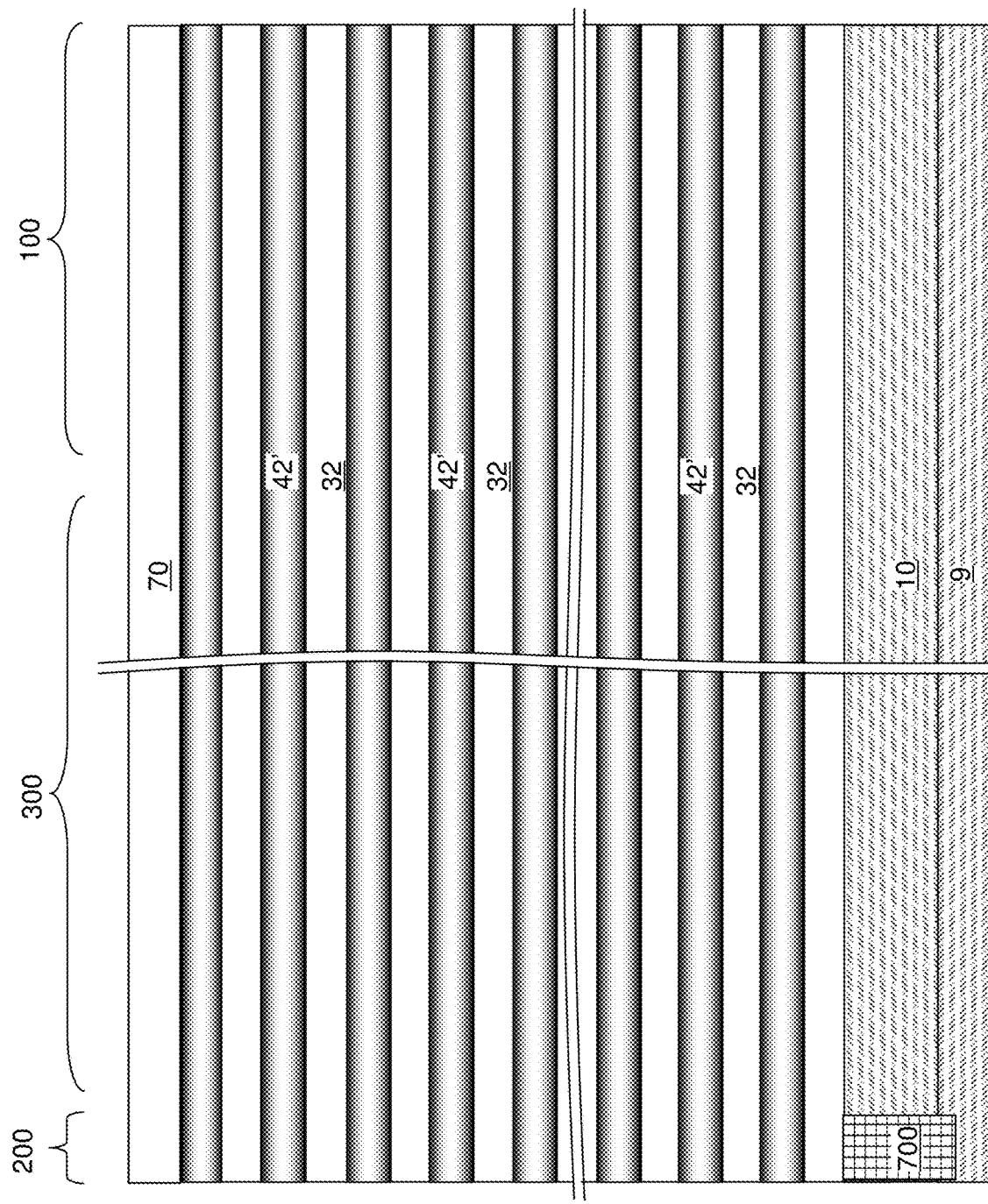
FIG. 17 is a vertical cross-sectional view of a second exemplary structure after formation of a vertical repetition of a unit layer stack including an insulating layer and a compositionally-graded sacrificial material layer according to a second embodiment of the present disclosure.

Referring to FIG. 17, a second exemplary structure according to a second embodiment of the present disclosure can be derived from the first exemplary structure illustrated in FIG. 2 by employing a compositionally-graded sacrificial material layer 42' in lieu of each composite sacrificial material layer 42. Each compositionally-graded sacrificial material layer 42' can be derived from any configuration of the composite sacrificial material layers 42 of the first exemplary structure by gradually varying the material compositions within each composite sacrificial material layer 42 such that a bottommost portion of the compositionally-graded sacrificial material layer 42' has a material composition of a first sacrificial material layer 423, a center portion of the compositionally-graded sacrificial material layer 42' has a material composition of a second sacrificial material layer 425, and a topmost portion of the compositionally-graded sacrificial material layer 42' has a material composition of a third sacrificial material layer 427.

Generally, a vertical repetition of a unit layer stack (32, 42') can be formed over a substrate (9, 10). The unit layer stack (32, 42') comprises, from bottom to top, an insulating layer 32 and a compositionally-graded sacrificial material layer 42' having a vertically-graded etch rate in an isotropic etchant that increases with a vertical distance from the substrate (9, 10) in a lower portion of the compositionally-graded sacrificial material layer 42' and decreases with the vertical distance from the substrate (9, 10) in an upper portion of the compositionally-graded sacrificial material layer 42'. The gradual compositional change in each compositionally-graded sacrificial material layer 42' is schematically illustrated by a gradual change in the darkness within the compositionally-graded sacrificial material layers 42' in FIG. 17.

In a first non-limiting illustrative example, the compositionally-graded sacrificial material layer 42' within each unit layer stack (32, 42') comprises, and/or consists essentially of, a silicon nitride material having a vertically graded density that has a lowest value at a center portion of the compositionally-graded sacrificial material layer 42' that is vertically spaced from a top surface and a bottom surface of the compositionally-graded sacrificial material layer 42'.

In a second non-limiting illustrative example, the compositionally-graded sacrificial material layer 42' within each unit layer stack (32, 42') comprises, and/or consists essentially of, a silicon-germanium alloy having a vertically graded germanium atomic concentration that has a peak germanium concentration at a center portion of the compositionally-graded sacrificial material layer 42' that is vertically spaced from a top surface and a bottom surface of the compositionally-graded sacrificial material layer 42'.

Figure 18:
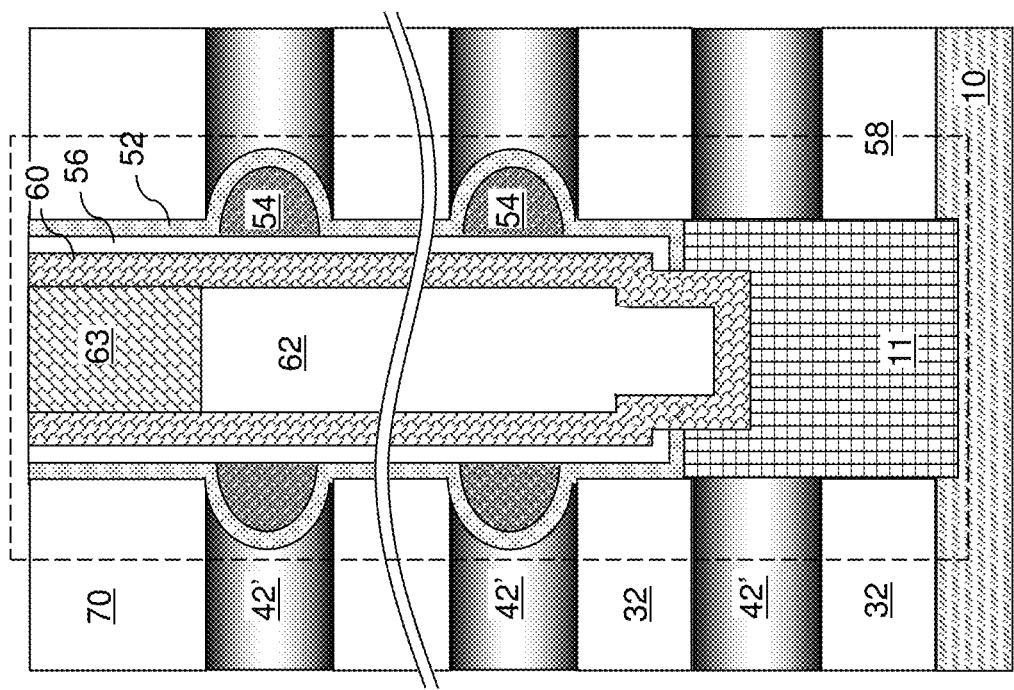
FIG. 18 is a vertical cross-sectional view of a memory opening fill structure in the second exemplary structure at a processing steps that corresponds to the processing step of FIG. 6.

Subsequently, the processing steps of FIGS. 3, 4A and 4B, and 5A-5J can be performed. Referring to FIG. 18, a region of the second exemplary structure is illustrated at the processing steps of FIGS. 5J and 6.

Generally, memory openings 49 having straight sidewalls can be formed through the vertical repetition of the insulating layers 32 and the compositionally-graded sacrificial material layers 42'. The compositionally-graded sacrificial material layers 42' can be laterally recessed selective to the insulating layers 32 by introducing a solution of the isotropic etchant into the memory openings 49. Each sidewall of the memory openings 49 comprises a concave surface of a respective compositionally-graded sacrificial material layer 42' between each vertically neighboring pair of the insulating layers 32. Thus, each sidewall of the memory openings 49 can include a vertically alternating sequence of straight cylindrical sidewall segments and concave cylindrical sidewall segments.

After formation of a vertical stack of annular lateral recesses at levels of the compositionally-graded sacrificial material layers 42' around each memory opening 49, a blocking dielectric layer 52 can be conformally deposited at peripheral portions of the memory openings 49, a memory material layer 54C can be conformally deposited on the blocking dielectric layer 52, and portions of the memory material layer 54C that are located outside the lateral recesses can be anisotropically etched by performing the processing steps of FIGS. 5D and 5E. Remaining portions of the memory material layer 54C in the lateral recesses comprise vertical stacks of memory elements 54, and each of the memory elements 54 has a respective convex outer sidewall and a respective straight inner sidewall.

Generally, each of the memory opening fill structures 58 may comprise a vertical semiconductor channel 60, a dielectric material liner 56 (which may be a tunneling dielectric layer) laterally surrounding the vertical semiconductor channel 60, and a vertical stack of discrete memory elements 54 laterally surrounding the dielectric material liner 56 and located within volumes of the lateral protrusions. Each discrete memory element 54 within the vertical stack of discrete memory elements 54 comprises a vertical inner sidewall and a convex outer sidewall that is laterally offset outward from the vertical inner sidewall by a greater lateral offset distance at a central segment thereof than at a top segment thereof and than at a bottom segment thereof. In one embodiment, the convex outer sidewall of each discrete memory element 54 may be adjoined to the vertical inner sidewall of a respective discrete memory element 54.

Figure 19:
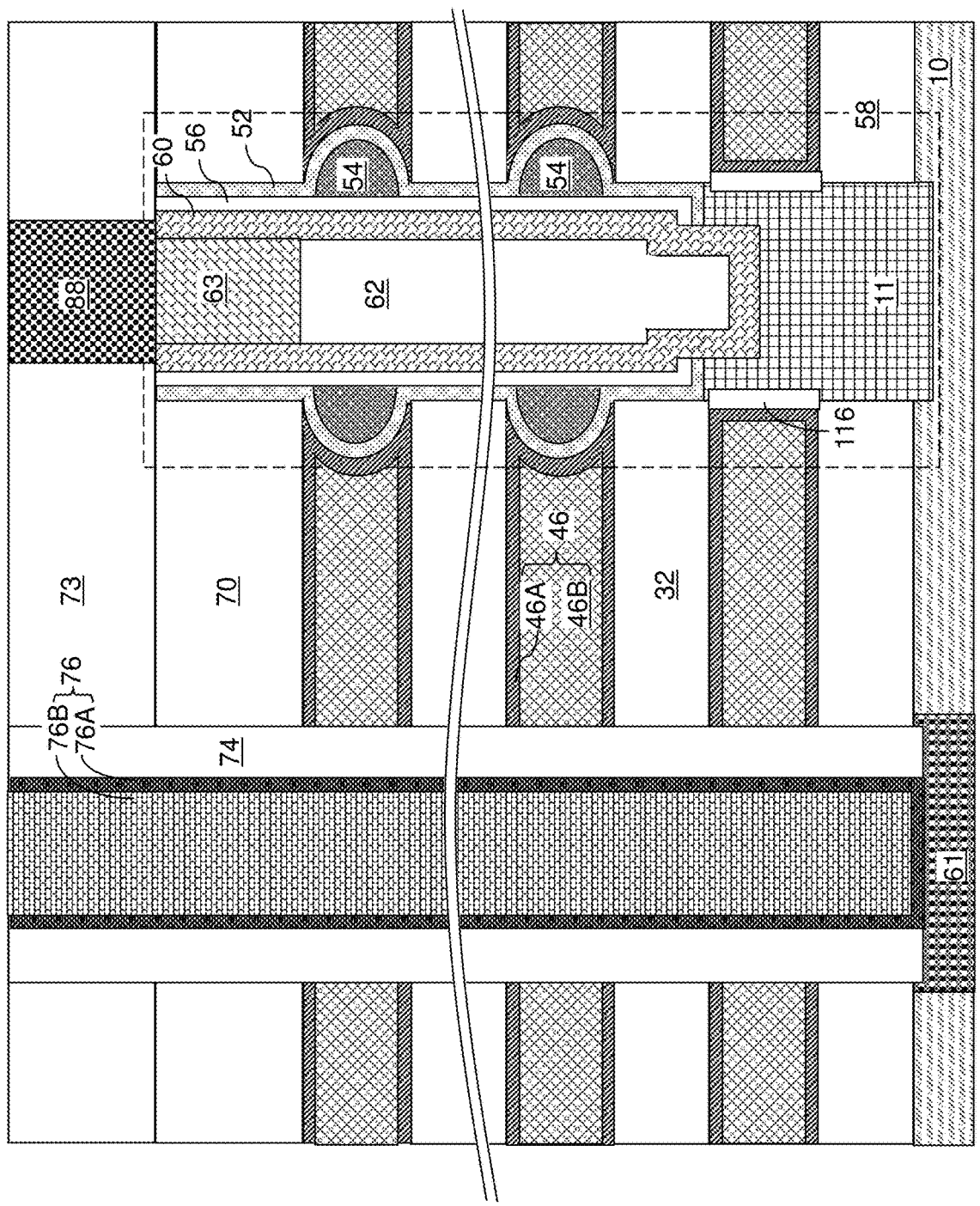
FIG. 19 is a vertical cross-sectional view of a region of the second exemplary structure at the processing steps of FIGS. 11A-11C.

Subsequently, the processing steps of FIGS. 7A and 7B, 8, 9A and 9B, 10, and 11A-11C can be performed. Referring to FIG. 19, a region of the second configuration of the first exemplary structure is illustrated at the processing steps of FIGS. 11A-11C.

Figure 20:
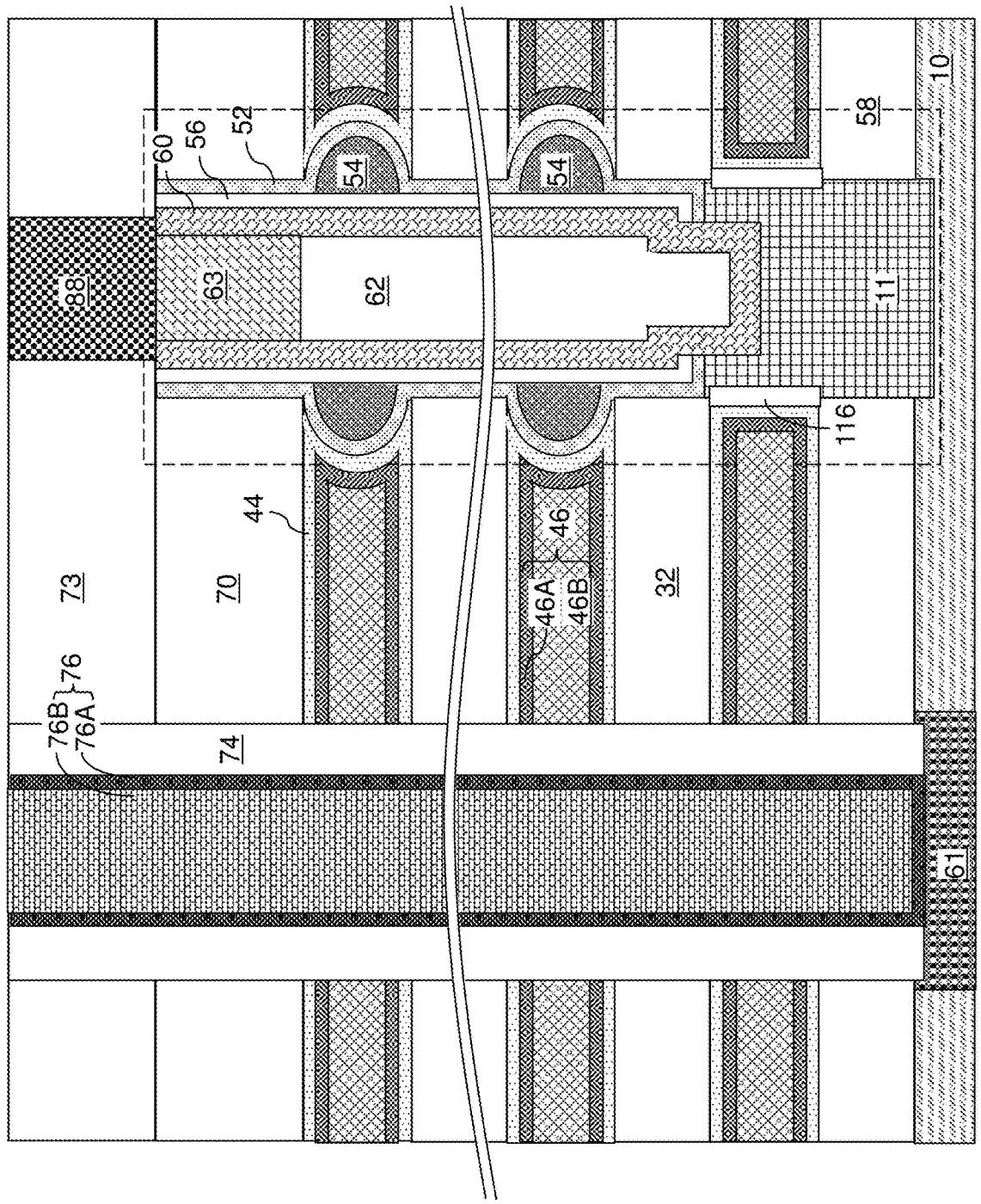
FIG. 20 is a vertical cross-sectional view of a region of an alternative configuration of the second exemplary structure at the processing steps of FIGS. 11A-11C.

Referring to FIG. 20, a region of an alternative configuration of the second exemplary structure is illustrated at the processing steps of FIGS. 11A-11C. The alternative configuration of the second exemplary structure can be derived from the second exemplary structure described above by forming a backside blocking dielectric layer 44 in each backside recess 43 directly on physically exposed surfaces of the blocking dielectric layers 52.

Referring to all drawings and according to various embodiments of the present disclosure, a three-dimensional memory device is provided, which comprises: an alternating stack of insulating layers 32 and electrically conductive layers 46 located over a substrate (9, 10); memory openings 49 vertically extending through the alternating stack (32, 46) and having lateral protrusions at levels of the electrically conductive layers 46; and memory opening fill structures 58 located in the memory openings 49, wherein each of the memory opening fill structures 58 comprises a vertical semiconductor channel 60, a dielectric material liner 56 laterally surrounding the vertical semiconductor channel 60, and a vertical stack of discrete memory elements 54 laterally surrounding the dielectric material liner 56 and located within volumes of the lateral protrusions, wherein each discrete memory element 54 within the vertical stack of discrete memory elements 54 comprises a vertical inner sidewall and a convex or stepped outer sidewall that is laterally offset outward from the vertical inner sidewall by a greater lateral offset distance at a central segment thereof than at a top segment thereof and than at a bottom segment thereof.

In one embodiment, the convex or stepped outer sidewall of each discrete memory element 54 comprises the stepped outer sidewall comprising a plurality of vertical outer sidewall segments and a plurality of horizontal outer sidewall segments that are adjoined to each other. In one embodiment, the top segment of the stepped outer sidewall of each discrete memory element 54 comprises a first one of the plurality of vertical outer sidewall segments of a respective one of the stepped outer sidewalls; the bottom segment of the stepped outer sidewall of each discrete memory element 54 comprises a second one of the plurality of vertical outer sidewall segments of the respective one of the stepped outer sidewalls; and the central segment of the stepped outer sidewall of each discrete memory element 54 comprises a third one of the plurality of vertical outer sidewall segments of the respective one of the stepped outer sidewalls. In one embodiment, the first one and the second one of the plurality of vertical outer sidewall segments are equidistant from the vertical semiconductor channel 60.

In one embodiment shown in FIGS. 15 and 16, the plurality of vertical outer sidewall segments of each stepped outer sidewall comprise at least five vertical outer sidewall segments that are laterally offset from the vertical semiconductor channel 60 by at least three different lateral offset distances; and the plurality of horizontal outer sidewall segments of each stepped outer sidewall comprise at least six horizontal outer sidewall segments that are vertically spaced from the substrate (9, 10) by different vertical distances.

In one embodiment, the convex or stepped outer sidewall of each discrete memory element 54 comprises the convex outer sidewall adjoined to the vertical inner sidewall of a respective discrete memory element 54.

In one embodiment, each of the memory opening fill structures 58 further comprises a blocking dielectric layer 52 in contact with an entirety of the convex or stepped outer sidewalls of the vertical stack of discrete memory elements 54. In one embodiment, all surfaces of the vertical stack of discrete memory elements 54 within each memory opening fill structure 58 are in direct contact with a respective surface of the blocking dielectric layer 52 and the dielectric material liner 56.

In one embodiment, each electrically conductive layer 46 of the electrically conductive layers 46 that laterally surrounds a respective discrete memory element 54 of the vertical stack of discrete memory elements 54 comprises a concave or stepped sidewall that faces the convex or stepped sidewall of the respective discrete memory element 54.

In one embodiment, the discrete memory elements 54 comprise charge storage elements; the dielectric material liner 56 comprises a tunneling dielectric layer; and the three-dimensional memory device comprises an array of vertical NAND strings.

The exemplary structures of the present disclosure can include a three-dimensional memory device. In one embodiment, the three-dimensional memory device comprises a three-dimensional NAND memory device. The electrically conductive layers 46 can comprise, or can be electrically connected to, a respective word line of the three-dimensional NAND memory device. The substrate (9, 10) can comprise a silicon substrate. The vertical NAND memory device can comprise an array of three-dimensional (e.g., vertical) NAND strings over the silicon substrate. At least one memory element 54 in a first device level of the array of three-dimensional NAND strings can be located over another memory element 54 at a level of another electrically conductive layer 46) in a second device level of the array of three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of three-dimensional NAND strings can comprise: a plurality of semiconductor channels (59, 11, 60), wherein at least one end portion (such as a vertical semiconductor channel 60) of each of the plurality of semiconductor channels (59, 11, 60) extends substantially perpendicular to a top surface of the substrate (9, 10); and a plurality of memory elements 54. Each memory element 54 can be located adjacent to a respective one of the plurality of semiconductor channels (59, 11, 60).

In one embodiment, the laterally protruding vertical cross-sectional profile of each memory element 54 can locally increase the electric field in the center of the laterally-protruding portion of each memory element 54, which reduces neighboring word line interference, and may lower the operating voltage of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   memory openings vertically extending through the alternating stack and having lateral protrusions at levels of the electrically conductive layers;
   memory opening fill structures located in the memory openings, wherein each of the memory opening fill structures comprises a vertical semiconductor channel, a dielectric material liner laterally surrounding the vertical semiconductor channel, and a vertical stack of discrete memory elements laterally surrounding the dielectric material liner and located within volumes of the lateral protrusions, wherein each discrete memory element within the vertical stack of discrete memory elements comprises a vertical inner sidewall and a stepped outer sidewall that is located entirely within a respective volume of a single lateral protrusion of the volumes of the lateral protrusions, is laterally offset outward from the vertical inner sidewall by a greater lateral offset distance at a central segment thereof than at a top segment thereof and than at a bottom segment thereof, and comprises a plurality of vertical outer sidewall segments and a plurality of horizontal outer sidewall segments that are adjoined to each other; and wherein:

the plurality of vertical outer sidewall segments of each stepped outer sidewall comprise at least five vertical outer sidewall segments that are laterally offset from the vertical semiconductor channel by at least three different lateral offset distances; and the plurality of horizontal outer sidewall segments of each stepped outer sidewall comprise at least six horizontal outer sidewall segments that are vertically spaced from the substrate by different vertical distances.

2. The three-dimensional memory device of claim 1, wherein:

the top segment of the stepped outer sidewall of each discrete memory element comprises a first one of the plurality of vertical outer sidewall segments of a respective one of the stepped outer sidewalls;

the bottom segment of the stepped outer sidewall of each discrete memory element comprises a second one of the plurality of vertical outer sidewall segments of the respective one of the stepped outer sidewalls; and the central segment of the stepped outer sidewall of each discrete memory element comprises a third one of the plurality of vertical outer sidewall segments of the respective one of the stepped outer sidewalls.

3. The three-dimensional memory device of claim 2, wherein the first one and the second one of the plurality of vertical outer sidewall segments are equidistant from the vertical semiconductor channel.

4. A three-dimensional memory device comprising:

an alternating stack of insulating layers and electrically conductive layers located over a substrate;

memory openings vertically extending through the alternating stack and having lateral protrusions at levels of the electrically conductive layers; and memory opening fill structures located in the memory openings, wherein each of the memory opening fill structures comprises a vertical semiconductor channel, a dielectric material liner laterally surrounding the vertical semiconductor channel, and a vertical stack of discrete memory elements laterally surrounding the dielectric material liner and located within volumes of the lateral protrusions, wherein each discrete memory element within the vertical stack of discrete memory elements comprises a vertical inner sidewall and a convex outer sidewall that is laterally offset outward from the vertical inner sidewall by a greater lateral offset distance at a central segment thereof than at a top segment thereof and than at a bottom segment thereof, wherein the convex outer sidewall of each discrete memory element is adjoined to the vertical inner sidewall of a respective discrete memory element, wherein an entirety of the convex outer sidewall of each discrete memory element is convex; and wherein:

the plurality of vertical outer sidewall segments of each stepped outer sidewall comprise at least five vertical outer sidewall segments that are laterally offset from the vertical semiconductor channel by at least three different lateral offset distances; and the plurality of horizontal outer sidewall segments of each stepped outer sidewall comprise at least six horizontal outer sidewall segments that are vertically spaced from the substrate by different vertical distances.

5. The three-dimensional memory device of claim 1, wherein each of the memory opening fill structures further comprises a blocking dielectric layer in contact with an entirety of the stepped outer sidewalls of the vertical stack of discrete memory elements.

6. The three-dimensional memory device of claim 5, wherein all surfaces of the vertical stack of discrete memory elements within each memory opening fill structure are in direct contact with a respective surface of the blocking dielectric layer and the dielectric material liner.

7. The three-dimensional memory device of claim 1, wherein each electrically conductive layer of the electrically conductive layers that laterally surrounds a respective discrete memory element of the vertical stack of discrete memory elements comprises a stepped sidewall that faces the stepped sidewall of the respective discrete memory element.

8. The three-dimensional memory device of claim 1, wherein:

the discrete memory elements comprise charge storage elements;

the dielectric material liner comprises a tunneling dielectric layer; and the three-dimensional memory device comprises an array of vertical NAND strings.

9. The three dimensional memory device of claim 1, wherein:

the plurality of vertical outer sidewall segments comprises at least three vertical outer sidewall segments; and the plurality of horizontal outer sidewall segments comprises at least four horizontal outer sidewall segments.

10. The three-dimensional memory device of claim 1, wherein:

the plurality of vertical outer sidewall segments comprises five vertical outer sidewall segments; and the plurality of horizontal outer sidewall segments comprises six horizontal outer sidewall segments.

11. The three-dimensional memory device of claim 1, wherein each discrete memory element within the vertical stack of discrete memory elements is located at a same level of a respective electrically conductive layer of the electrically conductive layers, and has a vertical extent that is less than a thickness of a vertical extent of the respective electrically conductive layer.

12. The three-dimensional memory device of claim 5, wherein each discrete memory element is located between a respective vertically neighboring pair of insulating layers of the insulating layers which includes a respective overlying insulating layer and a respective underlying insulating layer.

13. The three-dimensional memory device of claim 12, wherein:

each discrete memory element is located entirely below a respective first horizontal plane including a bottom surface of the respective overlying insulating layer; and each discrete memory element is located entirely above a respective second horizontal plane including a top surface of the respective underlying insulating layer.

14. The three-dimensional memory device of claim 13, wherein:
   a topmost one of the plurality of horizontal outer sidewall segments of each discrete memory element is vertically spaced from the respective first horizontal plane by a thickness of the blocking dielectric layer; and
   a bottommost one of the plurality of horizontal outer sidewall segments of each discrete memory element is vertically spaced from the respective second horizontal plane by the thickness of the blocking dielectric layer.

15. The three-dimensional memory device of claim 5, wherein the stepped outer sidewall of each discrete memory element is contacted by a respective set of at least four horizontally-extending surface segments of the blocking dielectric layer.

16. The three-dimensional memory device of claim 5, wherein:
   an electrically conductive layer of the electrically conductive layers comprises a stepped inner sidewall that faces one of the discrete memory elements; and
   the stepped inner sidewall of the electrically conductive layer comprises three vertically-extending surface segments that are adjoined by two horizontally-extending surface segments.

17. The three-dimensional memory device of claim 16, wherein:
   said one of the discrete memory elements is located between a neighboring pair of insulating layers of the insulating layers;
   the electrically conductive layer is vertically spaced from the neighboring pair of insulating layers by a backside blocking dielectric layer; and
   the electrically conductive layer is laterally spaced from said one of the discrete memory elements by a contoured portion of the backside blocking dielectric layer and a contoured portion of the blocking dielectric layer.

18. The three-dimensional memory device of claim 17, wherein the contoured portion of the backside blocking dielectric layer contacts the contoured portion of the blocking dielectric layer at a stepped interface including at least three vertical interface segments and at least two horizontal interface segments.

19. The three-dimensional memory device of claim 4, wherein:
   each of the memory opening fill structures further comprises a blocking dielectric layer in contact with an entirety of the convex outer sidewalls of the vertical stack of discrete memory elements;
   the blocking dielectric layer comprises an inner sidewall that comprises vertically-extending surface segments that contact surface segments of the dielectric material liner and concave surface segments that contact the convex outer sidewalls of the vertical stack of discrete memory elements;
   a first subset of the electrically conductive layers comprises a respective concave surface that faces a respective discrete memory element within the vertical stack of memory elements; and
   a second subset of the electrically conductive layers comprises a vertical sidewall that faces a respective one of the memory opening fill structures and is located at a level at which no discrete memory element is present.

* * * * *